United States Patent
Jang et al.

(10) Patent No.: US 11,781,063 B2
(45) Date of Patent: *Oct. 10, 2023

(54) QUANTUM DOTS, A COMPOSITION OR COMPOSITE INCLUDING THE SAME, AND AN ELECTRONIC DEVICE INCLUDING THE SAME

(71) Applicant: SAMSUNG ELECTRONICS CO., LTD., Suwon-si (KR)

(72) Inventors: Hyo Sook Jang, Suwon-si (KR); Yuho Won, Seoul (KR); Sungwoo Hwang, Suwon-si (KR); Ji Yeong Kim, Suwon-si (KR); Eun Joo Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/726,702

(22) Filed: Apr. 22, 2022

(65) Prior Publication Data
US 2022/0243125 A1    Aug. 4, 2022

Related U.S. Application Data

(63) Continuation of application No. 17/226,154, filed on Apr. 9, 2021, now Pat. No. 11,312,901, which is a
(Continued)

(30) Foreign Application Priority Data

Jan. 11, 2018 (KR) .................. 10-2018-0003832

(51) Int. Cl.
*H01L 51/52* (2006.01)
*C09K 11/08* (2006.01)
(Continued)

(52) U.S. Cl.
CPC ........ *C09K 11/0883* (2013.01); *C08F 220/06* (2013.01); *C08L 57/10* (2013.01);
(Continued)

(58) Field of Classification Search
CPC  C08F 220/06; C08F 220/20; C08F 220/1807; C09K 11/0883; C09K 11/025;
(Continued)

(56) References Cited

U.S. PATENT DOCUMENTS

| | | |
|---|---|---|
| 3,425,803 A1 | 1/2010 | Parce et al. |
| 7,645,397 B2 | 1/2010 | Parce et al. |

(Continued)

FOREIGN PATENT DOCUMENTS

| | | |
|---|---|---|
| CN | 106479482 A | 3/2017 |
| CN | 108219769 A | 6/2018 |

(Continued)

OTHER PUBLICATIONS

Eun-Jin Lee et al., "Improved Luminescent Characterization and Synthesis of InP/ZnS Quantum Dot with High-Stability Precursor", J. Korean Powder Metall. Inst., Nov. 23, 2015, pp. 385-390, vol. 22, No. 6.

(Continued)

*Primary Examiner* — Donald L Raleigh
(74) *Attorney, Agent, or Firm* — CANTOR COLBURN LLP

(57) ABSTRACT

A cadmium free quantum dot including a semiconductor nanocrystal core and a semiconductor nanocrystal shell disposed on the core, wherein the quantum dot does not include cadmium and includes indium and zinc, the quantum dot has a maximum photoluminescence peak in a red light wavelength region, a full width at half maximum (FWHM) of the maximum photoluminescence peak is less than or equal to about 40 nanometers (nm), an ultraviolet-visible (Continued)

(UV-Vis) absorption spectrum of the quantum dot includes a valley between about 450 nm to a center wavelength of a first absorption peak, and a valley depth (VD) defined by the following equation is greater than or equal to about 0.2, a quantum dot polymer composite including the same, and a display device including the quantum dot-polymer composite:

$$(Abs_{first} - Abs_{valley})/Abs_{first} = VD.$$

20 Claims, 7 Drawing Sheets

Related U.S. Application Data continuation of application No. 16/817,902, filed on Mar. 13, 2020, now Pat. No. 10,975,298, which is a continuation of application No. 16/245,728, filed on Jan. 11, 2019, now Pat. No. 10,590,340.

(51) Int. Cl.
| | |
|---|---|
| C08L 57/10 | (2006.01) |
| G02F 1/13357 | (2006.01) |
| C09D 133/00 | (2006.01) |
| C08F 220/06 | (2006.01) |
| C09D 133/02 | (2006.01) |
| H10K 50/115 | (2023.01) |
| H10K 59/38 | (2023.01) |
| B82Y 20/00 | (2011.01) |
| B82Y 40/00 | (2011.01) |
| G02F 1/1335 | (2006.01) |

(52) U.S. Cl.
CPC ......... *C09D 133/00* (2013.01); *C09D 133/02* (2013.01); *G02F 1/133617* (2013.01); *H10K 50/115* (2023.02); *H10K 59/38* (2023.02); *B82Y 20/00* (2013.01); *B82Y 40/00* (2013.01); *C08L 2203/20* (2013.01); *G02F 1/133614* (2021.01); *G02F 2202/022* (2013.01); *G02F 2202/102* (2013.01); *G02F 2202/36* (2013.01); *G02F 2203/20* (2013.01)

(58) Field of Classification Search
CPC ..... C09K 11/883; C09K 11/08; C09K 11/565; C08L 57/10; C09D 133/00; C09D 133/02; G02F 1/133617; G02F 1/01791; G02F 1/13; H10K 50/115; H10K 59/38; H10K 50/125; H10K 85/141; B82Y 40/00; H01L 33/502
See application file for complete search history.

(56) References Cited

U.S. PATENT DOCUMENTS

| 8,288,783 | B2 | 10/2012 | Kinomoto |
| 8,592,037 | B2 | 11/2013 | Parce et al. |
| 9,169,435 | B2 | 10/2015 | Guo et al. |
| 9,478,700 | B2 | 10/2016 | Daniels et al. |
| 9,631,141 | B2 | 4/2017 | Guo et al. |
| 9,685,583 | B2 | 6/2017 | Guo et al. |
| 9,884,993 | B2 | 2/2018 | Guo et al. |
| 10,424,695 | B2 | 9/2019 | Won et al. |
| 10,707,371 | B2 | 7/2020 | Guo et al. |
| 10,983,433 | B2 | 4/2021 | Park et al. |
| 11,316,079 | B2 | 4/2022 | Won et al. |
| 2007/0034833 | A1 | 2/2007 | Parce et al. |
| 2010/0140551 | A1 | 6/2010 | Parce et al. |
| 2011/0101387 | A1 | 2/2011 | Kinomoto |
| 2012/0068118 | A1 | 3/2012 | Parce et al. |
| 2014/0001405 | A1 | 1/2014 | Guo et al. |
| 2015/0232756 | A1 | 8/2015 | Guo et al. |
| 2015/0236195 | A1 | 8/2015 | Guo et al. |
| 2016/0096992 | A1 | 4/2016 | Guo et al. |
| 2016/0237344 | A1 | 8/2016 | Bakr et al. |
| 2017/0009134 | A1 | 1/2017 | Daniels et al. |
| 2017/0052444 | A1 | 2/2017 | Park et al. |
| 2017/0137360 | A1 | 5/2017 | Curley et al. |
| 2017/0222724 | A1 | 8/2017 | Chang et al. |
| 2017/0247611 | A1 | 8/2017 | Nick et al. |
| 2017/0250322 | A1 | 8/2017 | Wang et al. |
| 2017/0349824 | A1* | 12/2017 | Kan .................. C30B 29/48 |
| 2017/0373232 | A1* | 12/2017 | Kan .................. H10K 50/85 |
| 2018/0155623 | A1 | 6/2018 | Guo et al. |
| 2018/0312753 | A1 | 11/2018 | Bakr et al. |
| 2019/0011782 | A1 | 1/2019 | Pickett et al. |
| 2021/0286259 | A1 | 9/2021 | Park et al. |

FOREIGN PATENT DOCUMENTS

| JP | 2011040486 A | 2/2011 |
| KR | 20090038022 A | 4/2009 |
| KR | 1020150034755 A | 4/2015 |
| KR | 20160067143 A | 6/2016 |
| KR | 20160103366 A | 9/2016 |
| KR | 20170018468 A | 2/2017 |
| KR | 20170022951 A | 3/2017 |
| KR | 1722638 B1 | 4/2017 |
| KR | 20170056610 A | 5/2017 |

OTHER PUBLICATIONS

Parthiban Ramasamy et al., "Tunable, Bright, and Narrow-Band Luminescence from Colloidal Indium Phosphide Quantum Dots", Chemistry of Materials, Aug. 4, 2017, pp. 6893-6899, vol. 29.

Kuyong Yang et al., "Full Visible Range Covering InP/ZnS Nanocrystals with High Photometric Performance and Their Application to White Quantum Dot Light-Emitting Diodes", Advanced Material, Apr. 30, 2012, pp. 4180-4185, vol. 24.

Eunjoo Jang et al., "67-1: Invited Paper: Environmentally Friendly Quantum Dots for Display Applications," SID Symposium Digest of Technical Papers, Jun. 2, 2017, pp. 980-983, vol. 48, Issue 1.

Office Action dated Jul. 21, 2022, of the corresponding Chinese Patent Application No. 201910026869.6.

* cited by examiner

Pattern Preparation by using a photoresist

Repeating the Patterning Process three times

QUANTUM DOTS, A COMPOSITION OR COMPOSITE INCLUDING THE SAME, AND AN ELECTRONIC DEVICE INCLUDING THE SAME

CROSS-REFERENCE TO RELATED APPLICATIONS

This application is a continuation application of U.S. patent application Ser. No. 17/226,154, filed on Apr. 9, 2021, which is continuation application of U.S. patent application Ser. No. 16/817,902, filed on Mar. 13, 2020, now U.S. Pat. No. 10,975,298, which is continuation application of U.S. patent application Ser. No. 16/245,728, filed on Jan. 11, 2019, now U.S. Pat. No. 10,590,340, which claims priority to and the benefit of Korean Patent Application No. 10-2018-0003832 filed in the Korean Intellectual Property Office on Jan. 11, 2018, and all the benefits accruing therefrom under 35 U.S.C. § 119, the entire contents of which in their entirety are incorporated herein by reference.

BACKGROUND

1. Field

Quantum dots, compositions, or composites including the same, and electronic devices (e.g., display devices) including the same are disclosed.

2. Description of the Related Art

Quantum dots (i.e., nano-sized semiconductor nanocrystals) may have different energy bandgaps by controlling sizes and compositions of nanocrystals, and thus may emit light of various photoluminescence wavelengths. Quantum dots may exhibit electroluminescent and photoluminescence properties. In a chemical wet process, organic materials such as ligands, dispersing agents or solvents are coordinated on, e.g., bound to, the surface of the semiconductor nanocrystal during a crystal growth to provide quantum dots having controlled sizes and photoluminescence characteristics. Photoluminescence properties of quantum dots may be applied in various fields. In terms of an environmental standpoint, developments for cadmium free quantum dots capable of providing improved photoluminescence properties are desirable.

SUMMARY

An embodiment provides a cadmium free quantum dot having improved photoluminescence properties.

An embodiment provides a method of producing the cadmium free quantum dot.

An embodiment provides a composition including the cadmium free quantum dot.

An embodiment provides a quantum dot-polymer composite including the cadmium free quantum dot.

An embodiment provides an electronic device (e.g., a display device) including the quantum dot-polymer composite.

In an embodiment, a cadmium free quantum dot includes a semiconductor nanocrystal core and a semiconductor nanocrystal shell disposed on the core and does not include cadmium, wherein the quantum dot includes indium and zinc and has a maximum photoluminescence peak in a red light wavelength region, a full width at half maximum (FWHM) of the maximum photoluminescence peak is less than or equal to about 40 nanometers (nm), an ultraviolet-visible (UV-Vis) absorption spectrum of the quantum dot includes a valley between about 450 nm and a first absorption peak wavelength, and a valley depth (VD) defined by the following equation is greater than or equal to about 0.2:

$$(Abs_{first} - Abs_{valley})/Abs_{first} = VD$$

wherein, $Abs_{first}$ is an absorption intensity at the first absorption peak wavelength and $Abs_{valley}$ is an absorption intensity at a lowest point of the valley.

The red light wavelength region may be in a range of greater than or equal to about 600 nm and less than or equal to about 650 nm.

The full width at half maximum (FWHM) of the maximum photoluminescence peak may be less than or equal to about 39 nm.

The FWHM of the maximum photoluminescence peak may be less than or equal to about 38 nm.

The FWHM of the maximum photoluminescence peak may be less than or equal to about 37 nm.

The half width at half maximum (HWHM) of the first absorption peak may be less than or equal to about 25 nm.

A quantum efficiency (quantum yield) of the cadmium free quantum dot may be greater than or equal to about 80%. A quantum efficiency of the cadmium free quantum dot may be greater than or equal to about 85%. A Quantum efficiency of the cadmium free quantum dot may be greater than or equal to about 88%.

The cadmium free quantum dot may have a mole ratio of the zinc to the indium that is greater than or equal to about 10:1 and less than or equal to about 40:1.

The cadmium free quantum dot may have a size of greater than or equal to about 6 nm.

The cadmium free quantum dot may have a mole ratio of the zinc to the indium of greater than or equal to about 12:1 and less than or equal to about 30:1 and a size of greater than or equal to about 7 nm.

The semiconductor nanocrystal core may include a Group III-V compound. The Group III-V compound may include indium as a Group III metal.

The semiconductor nanocrystal core may not include zinc.

The semiconductor nanocrystal core may have a size of greater than or equal to about 2.5 nm.

The shell may include a first semiconductor nanocrystal shell including zinc and selenium and a second semiconductor nanocrystal shell disposed on the first semiconductor nanocrystal shell, the second semiconductor nanocrystal shell including zinc and sulfur.

The first semiconductor nanocrystal shell may be disposed directly on the surface of the semiconductor nanocrystal core. The first semiconductor nanocrystal shell may not include sulfur.

The first semiconductor nanocrystal shell may have a thickness of greater than or equal to about 3 monolayers.

The first semiconductor nanocrystal shell may have a thickness of less than or equal to about 10 monolayers.

The second semiconductor nanocrystal shell may be an outermost layer of the quantum dot.

The second semiconductor nanocrystal shell may be disposed directly on the first semiconductor nanocrystal shell.

The second semiconductor nanocrystal shell may include ZnSeS, ZnS, or a combination thereof.

In the quantum dot, a ratio of a total mole amount of sulfur and selenium to a mole amount of indium [(S+Se)/In] may be greater than or equal to about 10:1, for example, greater than or equal to about 11:1 and less than or equal to about 40:1, for example less than or equal to about 30:1, less than or equal to about 20, or less than or equal to about 15.

The cadmium free quantum dot may have a molar ratio of selenium to sulfur of greater than or equal to about 1:1, for example, greater than or equal to about 1.1:1. The cadmium free quantum dot may have a molar ratio of selenium to sulfur of less than or equal to about 3:1, for example less than or equal to about 2.8:1.

A thickness of the semiconductor nanocrystal shell may be greater than about 1.5 nm, for example, greater than or equal to about 2 nm, or greater than about 2 nm.

In an embodiment, a quantum dot polymer composite includes a polymer matrix; and a plurality of quantum dots dispersed in the polymer matrix, wherein the plurality of quantum dots includes the aforementioned cadmium free quantum dots.

The polymer matrix may include a cross-linked polymer, a binder polymer including a carboxylic acid group, or a combination thereof.

The cross-linked polymer may include a polymerization product of a photopolymerizable monomer including a carbon-carbon double bond, a polymerization product of the photopolymerizable monomer and a multiple thiol compound having at least two thiol groups (e.g., at a terminal end of the multiple thiol compound), or a combination thereof.

The quantum dot polymer composite may include a metal oxide fine particle in the polymer matrix.

In an embodiment, a display device includes a light source and a light emitting element (e.g., a photoluminescent element), wherein the light emitting element includes the aforementioned quantum dot-polymer composite and the light source is configured to provide the light emitting element with incident light.

The incident light may have a photoluminescence peak wavelength of about 440 nm to about 460 nm.

The light emitting element may include a sheet of the quantum dot polymer composite.

The display device may further include a liquid crystal panel, and the sheet of the quantum dot polymer composite may be disposed between the light source and the liquid crystal panel.

The light emitting element may include a stacked structure including a substrate and a light emitting layer (e.g., a photoluminescent layer) disposed on the substrate, wherein the light emitting layer includes a pattern of the quantum dot polymer composite and the pattern includes at least one repeating section configured to emit light at a predetermined wavelength.

The display device may be configured to have color reproducibility of greater than or equal to about 80% measured in accordance with a BT2020 standard.

The pattern may include a first section configured to emit a first light and a second section configured to emit a second light having a different center wavelength from the first light.

The light source may include a plurality of light emitting units corresponding to each of the first section and the second section, wherein the light-emitting units may include a first electrode and a second electrode facing each other and an electroluminescence layer disposed between the first electrode and the second electrode.

The display device may further include a lower substrate, a polarizer disposed under the lower substrate, and a liquid crystal layer disposed between the stacked structure and the lower substrate, wherein the stacked structure is disposed so that the light emitting layer faces the liquid crystal layer.

The display device may further include a polarizer between the liquid crystal layer and the light emitting layer.

The light source may include a light emitting diode (LED) and optionally a light guide panel (LGP).

An embodiment provides a cadmium free quantum dot including a semiconductor nanocrystal core comprising InP, InAs, or a combination thereof; and a semiconductor nanocrystal shell comprising ZnSe, ZnSeS, ZnS, or a combination thereof disposed on the core, wherein the quantum dot has a maximum photoluminescence peak in a red light wavelength region of greater than or equal to about 600 nanometers and less than or equal to about 650 nanometers, a full width at half maximum of the maximum photoluminescence peak is less than or equal to about 37 nanometers, and a half width at half maximum of the first absorption peak is less than or equal to about 25 nanometers.

The cadmium free quantum dot according to an embodiment may emit red light having a relatively narrow full width at half maximum (FWHM) as well as improved luminous efficiency. The composition including the cadmium free quantum dot according to an embodiment may provide improved process stability. The cadmium free quantum dot may be used in various display devices and biological labelling (e.g., bio sensor, bio imaging, etc.), a photo detector, a solar cell, a hybrid composite, and the like. A display device including the cadmium free quantum dot according to an embodiment may provide improved display quality (increased color reproducibility under the next generation color standard BT2020 Reference).

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
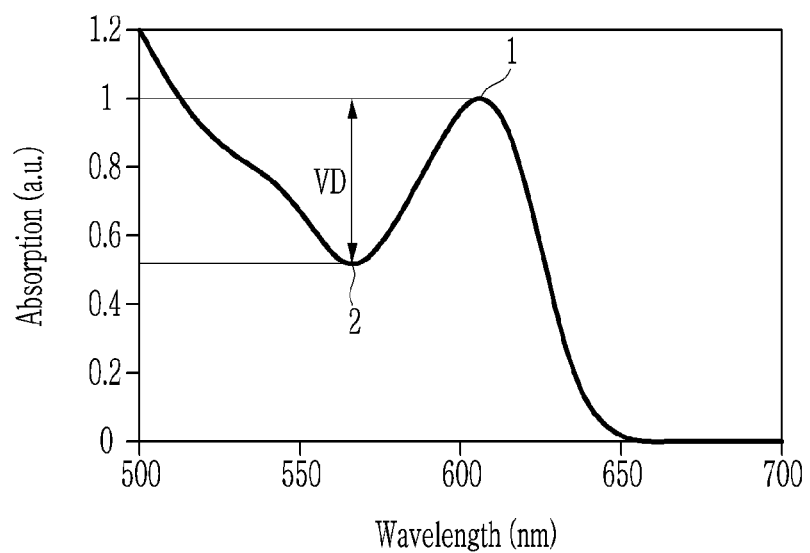
FIG. 1 shows a valley depth of a UV-Vis absorption spectrum of a quantum dot according to an embodiment.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" may refer to replacement of hydrogen of a compound or a group by a substituent selected from a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, unless a definition is otherwise provided, the term "hetero" means that the compound or group includes at least one (e.g., one to three) heteroatom(s), wherein the heteroatom(s) is each independently N, O, S, Si, P, or a combination thereof.

As used herein, unless a definition is otherwise provided, the term "aliphatic hydrocarbon group" refers to a C1 to C30 linear or branched alkyl group, C2 to C30 linear or branched alkenyl group, and C2 to C30 linear or branched alkynyl group, the term "aromatic hydrocarbon group" refers to a C6 to C30 aryl group or a C2 to C30 heteroaryl group, and the term "alicyclic hydrocarbon group" refers to a C3 to C30 cycloalkyl group, a C3 to C30 cycloalkenyl group, and a C3 to C30 cycloalkynyl group.

As used herein, unless a definition is otherwise provided, the term "(meth)acrylate" refers to acrylate and/or methacrylate. The (meth)acrylate may include a (C1 to 010 alkyl)acrylate and/or a (C1 to 010 alkyl)methacrylate.

In some embodiments, "hydrophobic moiety" may refer to a moiety providing the corresponding compound with a tendency to be agglomerated in an aqueous solution and to repel water. For example, the hydrophobic moiety may include an aliphatic hydrocarbon group having a carbon number of 1 or greater (e.g., 2 or greater, 3 or greater, 4 or greater, or 5 or greater) (alkyl, alkenyl, alkynyl, etc.), an aromatic hydrocarbon group having a carbon number of 6 or greater (phenyl, naphthyl, aralkyl group, etc.), or an alicyclic hydrocarbon group having a carbon number of 5 or greater (cyclohexyl, norbornene, norbornane, tricyclodecane, etc.).

As used herein, "dispersion" may refer to dispersion wherein a dispersed phase is a solid and a continuous phase includes a liquid. For example, "dispersion" may refer to a colloidal dispersion wherein the dispersed phase has a dimension of greater than or equal to about 1 nm, for example, greater than or equal to about 2 nm, greater than or equal to about 3 nm, or greater than or equal to about 4 nm and several micrometers (μm) or less, (e.g., about 2 μm or less or about 1 μm or less).

As used herein, the term "group" may refer to a group of Periodic Table.

As used herein, "Group I" may refer to Group IA and Group IB, and examples may include Li, Na, K, Rb, and Cs, but are not limited thereto.

As used herein, "Group II" may refer to Group IIA and Group IIB, and examples of Group II metal may be Cd, Zn, Hg, and Mg, but are not limited thereto.

As used herein, "Group III" may refer to Group IIIA and Group IIIB, and examples of Group III metal may be Al, In, Ga, and TI, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

A semiconductor nanocrystal particle (also known as a quantum dot) is a nano-sized crystalline material. The semiconductor nanocrystal particle may have a large surface area per a unit volume due to a relatively small size of the semiconductor nanocrystal particle and may exhibit different characteristics from bulk materials having the same composition due to a quantum confinement effect. Quantum dots may absorb light from an excitation source to be excited, and may emit energy corresponding to an energy bandgap of the quantum dots. Quantum dots have a potential applicability to various devices (e.g., an electronic device) due to unique photoluminescence characteristics. Quantum dots have properties that may be applicable to an electronic device and the like may be cadmium-based. However, cadmium may cause a serious environment/health problem and thus is a restricted element. As a type of cadmium free quantum dot, a Group III-V-based nanocrystal has been extensively researched. However, a cadmium free quantum dot may have poor photoluminescence properties (e.g., a full width at half maximum (FWHM) and luminous efficiency) compared with those of a cadmium-based quantum dot. Photoluminescence properties of the cadmium free quantum dot may substantially deteriorate, especially when subjected to various processes for application as an electronic device.

A cadmium free quantum dot according to an embodiment includes a semiconductor nanocrystal core and a semiconductor nanocrystal shell disposed on the core and does not include cadmium. The quantum dot includes indium and zinc, the quantum dot has a maximum photoluminescence peak in a red light wavelength region, a full width at half maximum (FWHM) of the maximum photoluminescence peak is less than or equal to about 40 nm, a UV-Vis absorption spectrum of the quantum dot has a valley portion between about 450 nm and a first absorption peak wavelength, and a valley depth (VD) defined by the following equation is greater than or equal to about 0.2:

$$(Abs_{first} - Abs_{valley})/Abs_{first} = VD$$

wherein, $Abs_{first}$ is an absorption intensity at the first absorption peak wavelength and $Abs_{valley}$ is an absorption intensity at the lowest point of the valley portion.

As used herein, the term "first absorption peak wavelength" refers to a wavelength of a main excitonic peak appearing first from the longest wavelength region of a UV-vis absorption spectrum of a quantum dot (i.e., appearing in the lowest energy region in the UV-Vis absorption spectrum).

The red light wavelength region may be greater than or equal to about 600 nm, for example, greater than or equal to about 605 nm, or greater than or equal to about 610 nm. The red light wavelength region may be less than or equal to about 650 nm, for example, less than or equal to about 645 nm, less than or equal to about 640 nm, less than or equal to about 635 nm, or less than or equal to about 630 nm. The first absorption peak may be present in a range of greater than or equal to about 580 nm, greater than or equal to about 590 nm, or greater than or equal to about 600 nm, greater than or equal to about 610 nm and less than or equal to about 650 nm, less than or equal to about 630 nm, less than or equal to about 620 nm, less than or equal to about 610 nm, or less than or equal to about 605 nm.

As used herein, the valley portion of the UV-Vis absorption spectrum refers to a portion 2 where a slope of a tangent line of a UV-Vis absorption spectrum curve changes from a negative value to a positive value, as a wavelength increases. The valley portion may exist near the first absorption peak 1 (see FIG. 1).

The cadmium free quantum dot (e.g., a Group III-V compound-based quantum dot including indium (In) and phosphorus (P)) has a smaller bandgap but a larger Bohr radius than a cadmium-based core such as a CdSe core and the like and thus has a large change of a full width at half maximum (FWHM) depending on a size. In addition, the core including indium and phosphorus (P) is weak about a surface oxidation, e.g., the surface may be relatively easily oxidized, and thus desired quantum efficiency and full width at half maximum (FWHM) may not be realized, e.g., provided, after the shell coating. A red light emitting cadmium free quantum dot (e.g., a quantum dot including indium and phosphorus) has a relatively large core size (e.g., compared with that of a green light emitting cadmium free quantum dot). The increased core size may cause non uniformity in a quantum dot size distribution. In addition, the red light emitting InP-based quantum dot maintains a relatively thin shell thickness for uniform shell coating, which may restrict an increase of luminous efficiency and a decrease of a full width at half maximum (FWHM). For example, the red light emitting InP-based quantum dot may have less than or equal to about 60% of luminous efficiency and greater than about 40 nm of a full width at half maximum (FWHM).

The quantum dot according to an embodiment has a large intensity difference between a first absorption peak and a valley portion adjacent to the first absorption peak in the UV-Vis absorption spectrum. The valley depth of the quantum dot according to an embodiment may be greater than or equal to about 0.2, for example, greater than or equal to about 0.21, greater than or equal to about 0.22, greater than or equal to about 0.24, greater than or equal to about 0.25, greater than or equal to about 0.26, greater than or equal to about 0.27, greater than or equal to about 0.28, greater than or equal to about 0.29, greater than or equal to about 0.30, greater than or equal to about 0.31, greater than or equal to about 0.32, greater than or equal to about 0.33, greater than or equal to about 0.34, or greater than or equal to about 0.35.

The quantum dot according to an embodiment may have HWHM of less than about 25 nm, for example, less than or equal to about 24 nm, or less than or equal to about 23 nm in a UV-Vis absorption spectrum.

Figure 2:
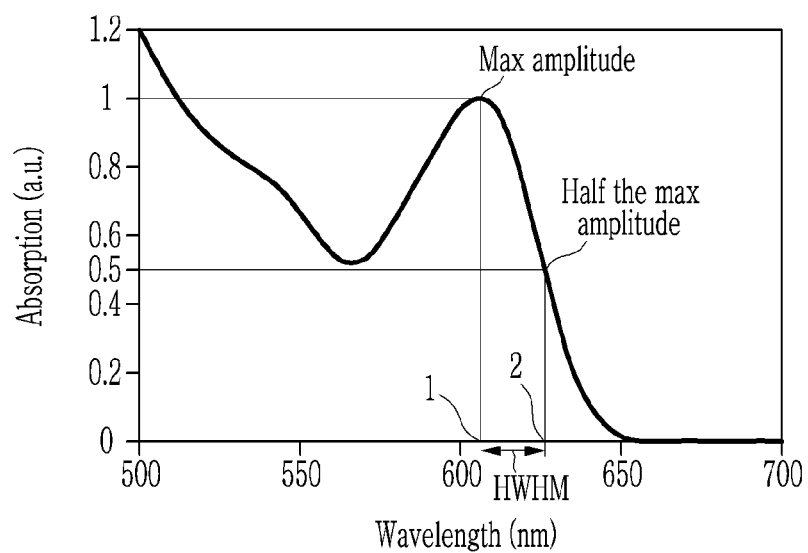
FIG. 2 shows a half width at half maximum (HWHM) of a first absorption peak in a UV-Vis absorption spectrum of quantum dot according to an embodiment.

The present inventors have found that a valley depth or a half width at half maximum (hereinafter, HWHM) in a UV-Vis absorption spectrum of the quantum dot has a correlation with a FWHM of a maximum photoluminescence peak of a quantum dot. As used herein, the term "half width at half maximum" refers to a right half width of a UV-vis absorption peak measured from the first absorption peak wavelength 1 to a point 2 on the absorption intensity axis (i.e., y-axis) which is half the maximum amplitude in a lower energy (a longer wavelength) region. (see FIG. 2)

Without being bound by any theory, it is believed that the valley depth may represent size uniformity of a quantum dot (or a core) or shell coating uniformity of a core-shell quantum dot. Without wishing to be bound by any theory, the greater the valley depth, the higher the size uniformity of a quantum dot (or a core) or shell coating uniformity of a core-shell quantum dot is. The quantum dot according to an embodiment may have a full width at half maximum (FWHM) of less than about 41 nm, for example, less than or equal to about 40 nm, less than or equal to about 39 nm, less than or equal to about 38 nm, or less than or equal to about 37 nm.

In an embodiment, the semiconductor nanocrystal core may include a Group III-V compound. For example, the semiconductor nanocrystal core may include indium. The semiconductor nanocrystal core may include phosphorus. The semiconductor nanocrystal core may include InP, InAs, InPAs, GaP, GaAs, InGaP, InGaAs, InGaPAs, or a combination thereof. The semiconductor nanocrystal core may not include zinc, i.e., may be free of zinc or have no zinc added.

The size of the core may be desirably selected considering a photoluminescence wavelength. For example, the size of the core may be greater than or equal to about 2.5 nm, greater than or equal to about 2.6 nm, greater than or equal to about 2.7 nm, greater than or equal to about 2.8 nm, or greater than or equal to about 2.9 nm. For example, the size of the core may be less than or equal to about 4.5 nm, for example less than or equal to about 4 nm, or less than or equal to about 3.5 nm.

The shell may include a first semiconductor nanocrystal shell including zinc and selenium. The shell may further include the second semiconductor nanocrystal shell including zinc and sulfur and being disposed on the first semiconductor nanocrystal shell. In an embodiment, the quantum dot may include a core including indium phosphide (e.g., InP). The quantum dot may have a core-multi-layered shell structure. For example, the quantum dot may include a first shell directly on the core and including ZnSe, ZnSeS, or a combination thereof. The quantum dot may have a core-multi-layered shell structure having a second shell directly on the first shell, having a different composition from the first shell, and including ZnS, ZnSeS, or a combination thereof.

The cadmium free quantum dot may have a mole ratio of the zinc relative to the indium of greater than or equal to about 10:1. The quantum dot according to an embodiment includes a coating (a shell) having improved quality and an increased thickness on a core, and the mole ratio of the zinc relative to the indium may represent these characteristics. In the cadmium free quantum dot, the mole ratio of the zinc relative to the indium may be greater than or equal to about 10.5:1, greater than or equal to about 11:1, greater than or equal to about 11.5:1, greater than or equal to about 12:1, or greater than or equal to about 12.5:1. In the cadmium free quantum dot, the mole ratio of the zinc relative to the indium may be less than or equal to about 40:1, for example, less than or equal to about 35:1, less than or equal to about 30:1, less than or equal to about 25:1, less than or equal to about 24:1, less than or equal to about 23:1, less than or equal to about 22:1, less than or equal to about 21:1, less than or equal to about 20:1, or less than or equal to about 19.5:1.

The first semiconductor nanocrystal shell may include ZnSe. The first semiconductor nanocrystal shell may not include sulfur (S), e.g., may be free of S or have no S added. For example, the first semiconductor nanocrystal shell may not include, e.g., may be free of, ZnSeS. The first semiconductor nanocrystal shell may be disposed directly on the semiconductor nanocrystal core. The first semiconductor nanocrystal shell may have a thickness of greater than or equal to about 3 monolayers (ML), or greater than or equal to about 4 ML. The first semiconductor nanocrystal shell may have a thickness of less than or equal to about 10 ML, for example, less than or equal to about 9 ML, less than or equal to about 8 ML, or less than or equal to about 7 ML.

In the quantum dot according to an embodiment, a mole ratio of selenium with respect to indium may be greater than or equal to about 5.7:1, for example, greater than or equal to about 5.8:1, greater than or equal to about 5.9:1, greater than or equal to about 6.0:1, greater than or equal to about 6.1:1, greater than or equal to about 6.2:1, greater than or equal to about 6.3:1, greater than or equal to about 6.4:1, greater than or equal to about 6.5:1, greater than or equal to about 6.6:1, or greater than or equal to about 6.7:1. In the quantum dot according to an embodiment, a mole ratio of selenium with respect to indium may be less than or equal to about 20:1, less than or equal to about 19:1, less than or equal to about 18:1, less than or equal to about 17:1, less than or equal to about 16:1, less than or equal to about 15:1, less than or equal to about 14:1, less than or equal to about 13:1, less than or equal to about 12:1, less than or equal to about 11:1, or less than or equal to about 10:1. Without being bound by any theory, the quantum dot according to an embodiment includes a first semiconductor nanocrystal shell having a relatively increased thickness, and this shell may contribute to accomplishing shell uniformity and improving optical properties (a valley depth, HWHM, a full width at half maximum (FWHM), and the like) of the quantum dot.

The second semiconductor nanocrystal shell may be an outermost layer of the quantum dot. The second semiconductor nanocrystal shell may be disposed directly on the first semiconductor nanocrystal shell. The second semiconductor nanocrystal shell may include ZnSeS, ZnS, or a combination thereof. In the quantum dot according to an embodiment, a molar amount ratio of sulfur with respect to indium may be greater than or equal to about 2:1, for example, greater than or equal to about 3:1, greater than or equal to about 3.1:1, greater than or equal to about 3.2:1, greater than or equal to about 3.4:1, greater than or equal to about 4:1, or greater than or equal to about 5:1. In the quantum dot according to an embodiment, a mole ratio of sulfur with respect to indium may be less than or equal to about 20:1, less than or equal to about 19:1, less than or equal to about 18:1, less than or equal to about 17:1, less than or equal to about 16:1, less than or equal to about 15:1, less than or equal to about 14:1, less than or equal to about 13:1, less than or equal to about 12:1, less than or equal to about 11:1, or less than or equal to about 10:1. In the quantum dot according to an embodiment, a mole ratio of selenium with respect sulfur may be greater than or equal to about 1:1, for example, greater than or equal to about 1.1:1, greater than or equal to about 1.2:1, greater than or equal to about 1.3:1, or greater than or equal to about 1.4:1. In the quantum dot according to an embodiment, a mole ratio of selenium with respect to sulfur may be less than or equal to about 5:1, for example, less than or equal to about 4:1, less than or equal to about 3.5:1, or less than or equal to about 3:1. The cadmium free quantum dot having the shell of the composition may exhibit improved optical properties (valley depth, HWHM, full width at half maximum (FWHM), etc.).

In the cadmium free quantum dot, a mole ratio of a sum of selenium and sulfur with respect to indium (i.e., (S+Se):In) may be greater than or equal to about 3:1, greater than or equal to about 4:1, greater than or equal to about 5:1, greater than or equal to about 6:1, greater than or equal to about 7:1, greater than or equal to about 8:1, greater than or equal to about 9:1, greater than or equal to about 10:1, greater than or equal to about 11:1, or greater than or equal to about 12:1. In the cadmium free quantum dot, the mole ratio of a sum of selenium and sulfur with respect to indium (i.e., (S+Se):In) may be less than or equal to about 40:1, less than or equal to about 35:1, less than or equal to about 30:1, less than or equal to about 25:1, less than or equal to about 24:1, less than or equal to about 23:1, less than or equal to about 22:1, less than or equal to about 21:1, less than or equal to about 20:1, less than or equal to about 19:1, or less than or equal to about 18:1.

The cadmium free quantum dot may have a size of greater than or equal to about 6 nm, for example, greater than or equal to about 6.5 nm, greater than or equal to about 7.0 nm, greater than or equal to about 7.5 nm, greater than or equal to about 7.6 nm, greater than or equal to about 7.7 nm, greater than or equal to about 7.8 nm, greater than or equal to about 7.9 nm, or greater than or equal to about 8.0 nm. The cadmium free quantum dot may for example have a size of less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, less than or equal to about 10 nm, or less than or equal to about 9 nm. The size of the quantum dot may be a particle diameter. When the quantum dot does not have a spherical shape, the size of the quantum dot may be a diameter, which is calculated by converting a two-dimensional area confirmed by a transmission electron microscope analysis into a circle. As used herein, the term "size" may refer to a size of a single particle or an average size of the particles.

A quantum dot-based display device may exhibit improved color purity, luminance, and the like. For example, a liquid crystal display (hereinafter, LCD) realizes colors by polarized light passing an absorption type color filter after passing a liquid crystal. LCD has a problem of a narrow viewing angle and low light transmittance due to the absorption type color filter. A quantum dot may emit light having theoretical quantum efficiency (QY) of about 100% and high color purity (e.g., less than or equal to about 40 nm of a full width at half maximum (FWHM)) and thus achieve increased luminous efficiency and improved color reproducibility. The absorption type color filter may be replaced with a photoluminescent type color filter including the quantum dot to realize a wider viewing angle and improved luminance.

The quantum dot may be dispersed in a host matrix (e.g., including a polymer and/or an inorganic material) to form a composite and thus be applied it to a device. The quantum dot according to an embodiment has improved optical properties and process stability, and accordingly, when included in a display device as a quantum dot polymer composite or its patterned form, improved luminance, a wide viewing angle, and improved color reproducibility may be realized. The quantum dot according to an embodiment has a relatively narrow full width at half maximum (FWHM) and accordingly, may realize improved color reproducibility measured in accordance with a BT2020 standard, which is a next generation standard of a display device. For example, a red light-emitting quantum dot with a full width at half maximum (FWHM) of greater than about 40 nm (e.g., about 45 nm) may exhibit a color reproducibility of less than or equal to about 86% (R: 635 nm, G: 530 nm, Blue LED 448 nm, assuming the same R/G full width at half maximum) measured in accordance with a BT2020 standard. On the other hand, the red light-emitting quantum dot with a full width at half maximum (FWHM) of less than about 40 nm may exhibit a color reproducibility of greater than or equal to about 88% (e.g., greater than or equal to about 90%) measured in accordance with a BT2020.

A shape of the quantum dot is not particularly limited, may for example be a spherical, polyhedron, pyramid, multipod, or cube shape, nanotube, nanowire, nanofiber, nanosheet, or a combination thereof, but is not limited thereto. The quantum dot may include the organic ligand and/or the organic solvent which will be described below, on its surface. The organic ligand and/or the organic solvent may be bound to the surface of the quantum dot.

An embodiment provides a method of producing the above cadmium free quantum dot including forming a first semiconductor nanocrystal shell on the semiconductor nanocrystal core by reacting a zinc-containing precursor with a selenium-containing precursor at first reaction temperature for greater than or equal to about 40 minutes in the presence of the semiconductor nanocrystal core including indium in a heated organic solvent and organic ligand; and forming a second semiconductor nanocrystal shell on the first semiconductor nanocrystal shell by reacting a zinc-containing precursor, a sulfur-containing precursor, and if necessary, a selenium precursor at a second reaction temperature in the presence of a particle having the first semiconductor nanocrystal shell formed on the semiconductor nanocrystal core in the organic solvent and the organic ligand.

In this method, a total injection mole ratio of the zinc-containing precursor relative to that of the indium may be greater than or equal to about 15:1, for example, greater than or equal to about 16:1, greater than or equal to about 17:1, greater than or equal to about 18:1, greater than or equal to about 19:1, or greater than or equal to about 20:1. In the method, a total injection mole ratio of the zinc-containing precursor relative to that of the indium may be less than or equal to about 50:1, less than or equal to about 45:1, less than or equal to about 40:1, less than or equal to about 35:1, less than or equal to about 30:1, or less than or equal to about 25:1.

Amounts of the selenium-containing precursor and the sulfur-containing precursor with respect to the core may be adjusted so that the resulting cadmium free quantum dot may have the aforementioned composition and the structure.

Details of the cadmium free quantum dot are the same as described above.

The organic ligand may include $RCOOH$, $RNH_2$, $R_2NH$, $R_3N$, $RSH$, $RH_2PO$, $R_2HPO$, $R_3PO$, $RH_2P$, $R_2HP$, $R_3P$, $ROH$, $RCOOR'$, $RPO(OH)_2$, $RHPOOH$, $RHPOOH$ (wherein R and R' are the same or different, and are independently a hydrogen, C1 to C40 aliphatic hydrocarbon group, such as C1 to C40 (e.g., C3 to C24) alkyl or C2 to C40 (e.g., C3 to C24) alkenyl group, C2 to C40 (e.g., C3 to C24) alkynyl group or a C6 to C40 aromatic hydrocarbon group such as a C6 to C20 aryl group), a polymeric organic ligand, or a combination thereof.

The organic ligand may coordinate to, e.g., be bound to, the surface of the obtained nanocrystal and help the nanocrystal to be well dispersed in the solution and/or may affect light emitting and electrical characteristics of quantum dots. Examples of the organic ligand may include methane thiol, ethane thiol, propane thiol, butane thiol, pentane thiol, hexane thiol, octane thiol, dodecane thiol, hexadecane thiol, octadecane thiol, or benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphine such as substituted or unsubstituted methyl phosphine (e.g., trimethyl phosphine, methyldiphenyl phosphine, etc.), substituted or unsubstituted ethyl phosphine (e.g., triethyl phosphine, ethyldiphenyl phosphine, etc.), substituted or unsubstituted propyl phosphine, substituted or unsubstituted butyl phosphine, substituted or unsubstituted pentyl phosphine, or substituted or unsubstituted octylphosphine (e.g., trioctylphosphine (TOP)); phosphine oxide such as substituted or unsubstituted methyl phosphine oxide (e.g., trimethyl phosphine oxide, methyldiphenyl phosphineoxide, etc.), substituted or unsubstituted ethyl phosphine oxide (e.g., triethyl phosphine oxide, ethyldiphenyl phosphineoxide, etc.), substituted or unsubstituted propyl phosphine oxide, substituted or unsubstituted butyl phosphine oxide, or substituted or unsubstituted octyl phosphine oxide (e.g., trioctylphosphineoxide (TOPO); diphenyl phosphine, triphenyl phosphine compound, or an oxide compound thereof; a mono- or di(C5 to C20 alkyl)phosphinic acid such as mono- or dihexylphosphinic acid, mono- or dioctylphosphinic acid, mono- or didodecylphosphinic acid, mono- or di(tetradecyl)phosphinic acid, mono- or di(hexadecyl)phosphinic acid, mono- or di(octadecyl)phosphinic acid, or a combination thereof; a C5 to C20 alkylphosphinic acid, a C5 to C20 alkylphosphonic acid such as hexylphosphonic acid, octylphosphonic acid, dodecylphosphonic acid, tetradecylphosphonic acid, hexadecylphosphonic acid, octadecylphosphonic acid, or a combination thereof; and the like, but are not limited thereto. One or more organic ligands may be used.

The solvent may a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; a phosphine substituted with a C6 to C22 alkyl group such as trioctylphosphine; a phosphine oxide substituted with a C6 to C22 alkyl group such as trioctylphosphine oxide; a C12 to C22 aromatic ether such as phenyl ether, or benzyl ether, or a combination thereof. Types and amounts of the solvent may be appropriately selected considering precursors and organic ligands.

A mixture of the organic solvent and the organic ligand may be heated at a predetermined temperature, for example, greater than or equal to about 100° C., greater than or equal to about 120° C., greater than or equal to about 150° C., greater than or equal to about 200° C., greater than or equal to about 250° C., or greater than or equal to about 270° C. and the first reaction temperature or less for example, under a vacuum and/or inert atmosphere.

Details of the semiconductor nanocrystal core including the indium are the same as set forth above. The semiconductor nanocrystal core including the indium may further comprise phosphorous. The core may be commercially available or may be prepared in a suitable method. The preparation of the core is not particularly limited and may be performed in a suitable method of producing an indium phosphide based core. In an embodiment, the core may be synthesized in a hot injection manner wherein a solution including a metal precursor (e.g., an indium precursor) and optionally a ligand is heated at a high temperature (e.g., of greater than or equal to about 200° C.) and then a phosphorous precursor is injected the heated hot solution. In other embodiments, the synthesis of the core may adopt a low temperature injection method. The prepared core may be injected the heated organic solvent at a temperature of greater than or equal to about 100° C.

The zinc-containing precursor is not particularly limited and may be desirably selected. For example, the zinc-containing precursor may be a Zn metal powder, an alkylated Zn compound, Zn alkoxide, Zn carboxylate, Zn nitrate, Zn perchlorate, Zn sulfate, Zn acetylacetonate, Zn halide, Zn carbonate, Zn cyanide, Zn hydroxide, Zn oxide, Zn peroxide, or a combination thereof. Examples of the zinc-containing precursor may be dimethyl zinc, diethyl zinc, zinc acetate, zinc acetylacetonate, zinc iodide, zinc bromide, zinc chloride, zinc fluoride, zinc carbonate, zin cyanide, zinc nitrate, zinc oxide, zinc peroxide, zinc perchlorate, zinc sulfate, and the like. One or more zinc-containing precursors may be used.

The selenium-containing precursor is not particularly limited and may be desirably selected. For example, the selenium-containing precursor includes selenium-trioctyl phosphine (Se-TOP), selenium-tributyl phosphine (Se-TBP), selenium-triphenyl phosphine (Se-TPP), tellurium-tributylphosphine (Te-TBP), or a combination thereof but is not limited thereto.

The first reaction temperature may be desirably selected. For example, the first reaction temperature may be greater than or equal to about 280° C., greater than or equal to about 290° C., greater than or equal to about 300° C., greater than or equal to about 310° C., or greater than or equal to about 315° C. After or while the mixture including the semiconductor nanocrystal core comprising indium and the zinc-containing precursor is heated at the first reaction temperature, the selenium-containing precursor may be greater than or equal to once (e.g., twice or more, three times or more) added.

A reaction time at the first reaction temperature may be greater than or equal to about 40 minutes, for example, greater than or equal to about 50 minutes, greater than or equal to about 60 minutes, greater than or equal to about 70 minutes, greater than or equal to about 80 minutes, greater than or equal to about 90 minutes and for example less than or equal to about 4 hours, less than or equal to about 3 hours, or less than or equal to about 2 hours.

The reaction at the first reaction temperature within the above time range may form the first semiconductor nanocrystal shell to have a thickness of greater than or equal to about three monolayers. Herein, an amount of the selenium precursor with respect to indium may be adjusted to form a first semiconductor nanocrystal shell having a predetermined thickness for a predetermined reaction time. In the method of an embodiment, selenium may be used in an amount of greater than or equal to about 7 moles, greater than or equal to about 8 moles, or greater than or equal to about 9 mol based on about 1 mol of indium. The amount of selenium based on 1 mol of indium may be less than or equal to about 20 mol or less than or equal to about 15 mol.

The method may not include cooling the reaction solution including a particle having the first semiconductor nanocrystal shell down to a temperature below 100° C. (for example, of less than or equal to about 50° C. (e.g., less than or equal to about 30° C. or room temperature).

The sulfur-containing precursor is not particularly limited and may be desirably selected. The sulfur-containing precursor may be hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfur, sulfide ammonium, sodium sulfide, or a combination thereof. The sulfur-containing precursor may be once or more (e.g., twice or more) injected.

For example, the second reaction temperature may be greater than or equal to about 280° C., greater than or equal to about 290° C., greater than or equal to about 300° C., greater than or equal to about 310° C., or greater than or equal to about 315° C. After or while heated at the second reaction temperature, the sulfur-containing precursor may be greater than or equal to once (e.g., twice or more, or three times or more) injected.

A reaction time at the second reaction temperature may be appropriately adjusted but is not particularly limited. For example, the reaction time at the second reaction temperature may be greater than or equal to about 30 minutes, greater than or equal to about 40 minutes, greater than or equal to about 50 minutes, greater than or equal to about 60 minutes, greater than or equal to about 70 minutes, greater than or equal to about 80 minutes, or greater than or equal to about 90 minutes and less than or equal to about 4 hours, less than or equal to about 3 hours, or less than or equal to about 2 hours.

An amount of a sulfur precursor with respect to indium may be adjusted to form a second semiconductor nanocrystal shell having a predetermined thickness for a predetermined reaction time. In an embodiment, an amount of sulfur per 1 mol of indium may be appropriately adjusted but not particularly limited. For example, the amount of sulfur per 1 mol of indium may be greater
than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, greater than or equal to about 10 moles, greater than or equal to about 11 moles, greater than or equal to about 12 moles, greater than or equal to about 13 moles, greater than or equal to about 14 moles, greater than or equal to about 15 moles, greater than or equal to about 16 moles, greater than or equal to about 17 moles, greater than or equal to about 18 moles, or greater than or equal to about 19 mol and less than or equal to about 40 moles, less than or equal to about 35 moles, less than or equal to about 30 moles, less than or equal to about 25 moles, less than or equal to about 20 moles, or less than or equal to about 15 moles, but is not limited thereto.

Amounts of the zinc containing precursor, the selenium-containing precursor, and the sulfur-containing precursor based on indium of the core may be selected considering the properties and the structure of the resulting cadmium free quantum dots.

When the non-solvent is added into the obtained final reaction solution, the organic ligand-coordinated nanocrystal may be separated (e.g., precipitated). The non-solvent may be a polar solvent that is miscible with the solvent used in the reaction and nanocrystals are not dispersible therein. The non-solvent may be selected depending on the solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof. The separation may be performed through a centrifugation, precipitation, chromatography, or distillation. The separated nanocrystal may be added to a washing solvent and washed, if necessary. The washing solvent has no particular limit and may have a similar solubility parameter to that of the ligand and may, for example, include hexane, heptane, octane, chloroform, toluene, benzene, and the like.

In an embodiment, a quantum dot composition includes the cadmium free quantum dot, optionally a binder polymer, a photopolymerizable monomer including a carbon-carbon double bond, and a photoinitiator. The composition may further include an organic solvent.

In the composition, the cadmium free quantum dot is the same as described above. In the composition, an amount of the quantum dot may be desirably selected considering a final use and a composition of the composition. In an embodiment, the amount of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt % based on a solid content of the composition. The amount of the quantum dot may be less than or equal to about 70 wt %, for example, less than or equal to about 65 wt %, less than or equal to about 60 wt %, less than or equal to about 55 wt %, or less than or equal to about 50 wt % based on a solid content of the composition.

In the composition according to an embodiment, the binder polymer includes a carboxylic acid group. The binder polymer may include a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a multiple aromatic ring-containing polymer having a backbone structure where two aromatic rings are bound to a quaternary carbon atom that is a constituent atom of another cyclic moiety in the main chain and including a carboxylic acid group (—COOH); or a combination thereof.

Examples of the first monomer may include unsaturated carboxylic acid such as acrylic acid, (meth)acrylic acid, maleic acid, itaconic acid, fumaric acid, 3-butenoic acid, and the like, but are not limited thereto. The first monomer may be at least one compound.

Examples of the second monomer may be a carboxylic acid vinyl ester compound such as vinyl acetate or vinyl benzoate; an alkenyl aromatic compound such as styrene, alpha-methyl styrene, vinyl toluene, or vinyl benzyl methyl ether; a unsaturated carbonic acid ester compound such as methyl acrylate, methyl (meth)acrylate, ethyl acrylate, ethyl (meth)acrylate, butyl acrylate, butyl (meth)acrylate, benzyl acrylate, benzyl (meth)acrylate, cyclohexyl acrylate, cyclohexyl (meth)acrylate, phenyl acrylate, or phenyl (meth)acrylate; unsaturated carbonic acid amino alkyl ester compound such as 2-amino ethyl acrylate, 2-amino ethyl (meth)acrylate, 2-dimethyl amino ethyl acrylate, or 2-dimethyl amino ethyl (meth)acrylate; maleimides such as N-phenylmaleimide, N-benzylmaleimide, N-alkylmaleimide; a unsaturated carbonic acid glycidyl ester compound such as glycidyl acrylate or glycidyl (meth)acrylate; a vinyl cyanide compound such as acrylonitrile, methacrylonitrile; or a unsaturated amide compound such as acryl amide or methacryl amide, but are not limited thereto. As the second monomer, at least one compound may be used.

Specific examples of the third monomer may include 2-hydroxy ethyl acrylate, 2-hydroxy ethyl (meth)acrylate, 2-hydroxy butyl acrylate, or 2-hydroxy butyl (meth)acrylate, but are not limited thereto. As the third monomer, at least one compound may be used.

In the carboxylic acid group-containing binder polymer, an amount of the first repeating unit derived from the first monomer may be greater than or equal to about 10 mole percent (mol %), for example, greater than or equal to about 15 mol %, greater than or equal to about 25 mol %, or greater than or equal to about 35 mol %. In the binder including a carboxyl group, an amount of the first repeating unit may be less than or equal to about 90 mol %, for example, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the carboxylic acid group-containing binder polymer, an amount of the second repeating unit derived from the second monomer may be greater than or equal to about 10 mol %, for example, greater than or equal to about 15 mol %, greater than or equal to about 25 mol %, or greater than or equal to about 35 mol %. In the binder polymer, an amount of the second a repeating unit may be less than or equal to about 90 mol %, for example, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the carboxylic acid group-containing binder polymer, an amount of the third repeating unit derived from the third monomer may be greater than or equal to about 1 mol %, for example, greater than or equal to about 5 mol %, greater than or equal to about 10 mol % or greater than or equal to about 15 mol %, if it is present. In the binder polymer, an amount of the third repeating unit may be less than or equal to about 30 mol %, for example, less than or equal to about 25 mol %, less than or equal to about 20 mol %, less than or equal to about 18 mol %, less than or equal to about 15 mol %, or less than or equal to about 10 mol %.

The carboxylic acid group-containing binder polymer may be a copolymer of (meth)acrylic acid; and at least one second/third monomer selected from arylalkyl(meth)acrylate, hydroxyalkyl (meth)acrylate, and styrene. For example, the binder polymer may be a (meth)acrylic acid/methyl (meth)acrylate copolymer, a (meth)acrylic acid/benzyl (meth)acrylate copolymer, a (meth)acrylic acid/benzyl (meth)acrylate/styrene copolymer, a (meth)acrylic acid/benzyl (meth)acrylate/2-hydroxy ethyl (meth)acrylate copolymer, or a (meth)acrylic acid/benzyl (meth)acrylate/styrene/2-hydroxy ethyl (meth)acrylate copolymer.

In an embodiment, the carboxylic acid group containing binder may include a multi-aromatic ring-containing polymer. The multi-aromatic ring-containing polymer may include a carboxylic acid group (—COOH) and a main chain having a backbone structure incorporated therein, wherein the backbone structure includes a cyclic group including a quaternary carbon atom, which is a part of the cyclic group, and two aromatic rings bound to the quaternary carbon atom. The carboxylic acid group may be bonded to the main chain. The multi-aromatic ring-containing polymer is also known as a cardo binder, which may be synthesized or commercially available (e.g., from Nippon Steel Chemical Co., Ltd.).

The binder polymer including the carboxylic acid may have an acid value of greater than or equal to about 50 milligrams of potassium hydroxide (KOH) per gram (mg KOH/g). For example, the carboxylic acid-containing binder polymer may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g. The acid value of the polymer may be for example less than or equal to about 250 mg KOH/g, for example, less than or equal to about 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto.

The binder polymer (e.g., containing the carboxylic acid group, such as the carboxylic acid group-containing binder) may have a weight average molecular weight of greater than or equal to about 1000 g/mol, for example, greater than or equal to about 2000 g/mol, greater than or equal to about 3000 g/mol, or greater than or equal to about 5000 g/mol. The binder polymer may have a weight average molecular weight of less than or equal to about 100000 g/mol, for example less than or equal to about 50000 g/mol.

In the composition, an amount of the binder polymer may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt % based on a total weight of the composition, but is not limited thereto. The amount of the binder polymer may be less than or equal to about 35 wt %, for example less than or equal to about 33 wt %, or less than or equal to about 30 wt % based on a total weight of the composition. Within the ranges, dispersion of the quantum dot may be ensured. The amount of the binder polymer may be about 0.5 wt % to about 55 wt % based on a total weight of a solid content of the composition.

In the composition, the photopolymerizable monomer including a carbon-carbon double bond may include the photopolymerizable acryl-based monomer. The photopolymerizable acryl-based monomer may include alkyl(meth) acrylate, ethylene glycoldi(meth)acrylate, triethylene glycoldi(meth)acrylate, diethylene glycoldi(meth)acrylate, 1,4-butanedioldi(meth)acrylate, 1,6-hexanedioldi(meth) acrylate, neopentylglycoldi(meth)acrylate, pentaerythritoldi (meth)acrylate, pentaerythritoltri(meth)acrylate, pentaerythritoltetra(meth)acrylate, dipentaerythritoldi (meth)acrylate, dipentaerythritoltri(meth)acrylate, dipentaerythritolpenta(meth)acrylate, pentaerythritolhexa(meth) acrylate, bisphenol A di(meth)acrylate, bisphenol A epoxyacrylate, trimethylolpropanetri(meth)acrylate, ethylene glycolmonomethylether (meth)acrylate, novolacepoxy (meth)acrylate, dipropylene glycoldi(meth)acrylate, tripropylene glycoldi(meth)acrylate, propylene glycoldi(meth) acrylate, tris(meth)acryloyloxyethyl phosphate, or a combination thereof.

An amount of the photopolymerizable monomer may be greater than or equal to about 0.5 wt %, for example, greater than or equal to about 1 wt % or greater than or equal to about 2 wt % based on a total weight of the composition. The amount of the photopolymerizable monomer may be less than or equal to about 30 wt %, for example, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt % based on a total weight of the composition.

The (photo) initiator included in the composition of an embodiment may be a compound that can initiate a radical polymerization of the acryl-based monomer ((meth)acrylate monomer) and/or a thiol compound which will be described below (e.g., by light). Types of the initiator are not particularly limited and may be selected appropriately. For example, the initiator may be a photo-initiator and may include a triazine compound, an acetophenone compound, a benzophenone compound, a thioxanthone compound, a benzoin compound, an oxime compound, an aminoketone compound, a phosphine or phosphine oxide compound, a carbazole compound, a diketone compound, a sulfonium borate compound, a diazo compound, a diimidazole compound, or a combination thereof, but it is not limited thereto. As an alternative to, or in addition to the foregoing photoinitiators, a carbazole compound, a diketone compound, a sulfonium borate compound, an azo compound (e.g., diazo compound), a biimidazole compound, or a combination thereof may be used as a photoinitiator.

In the composition of an embodiment, an amount of the initiator may be adjusted in view of the type and the amount of the photopolymerizable monomer as used. In an embodiment, the amount of the initiator may be greater than or equal to about 0.01 wt % or greater than or equal to about 1 wt % and less than or equal to about 10 wt %, less than or equal to about 9 wt %, less than or equal to about 8 wt %, less than or equal to about 7 wt %, less than or equal to about 6 wt %, or less than or equal to about 5 wt % based on a total weight of the composition, but is not limited thereto.

The composition may further include a (multiple or mono-functional) thiol compound having at least one thiol group at the terminal end, a metal oxide particulate, or a combination thereof.

When a plurality of metal oxide particles is present, the metal oxide particulates may include $TiO_2$, $SiO_2$, $BaTiO_3$, $Ba_2TiO_4$, ZnO, or a combination thereof. An amount of the metal oxide fine particle may be less than or equal to about 25 wt %, less than or equal to about 20 wt %, less than or equal to about 15 wt % and greater than or equal to about 1 wt %, or greater than or equal to about 5 wt % based on a total solid content of the composition. A particle size of the metal oxide fine particle is not particularly limited and may be selected appropriately. The particle size of the metal oxide fine particles may greater than or equal to about 100 nm, greater than or equal to about 150 nm, or greater than or equal to about 200 nm and less than or equal to about 1,000 nm, less than or equal to about 900 nm, or less than or equal to about 800 nm.

The thiol compound may be a dithiol compound, a trithiol compound, a tetrathiol compound, or a combination thereof. For example, the thiol compound may be glycol di-3-mercaptopropionate (e.g., ethylene glycol di-3-mercaptopropionate), glycol dimercapto acetate (e.g., ethylene glycol dimercaptoacetate), trimethylolpropanetris (3-mercaptopropionate), pentaerythritol tetrakis (3-mercaptopropionate), pentaerythritol tetrakis (2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

Based on a total weight of the composition, an amount of the thiol compound may be less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt %. The amount of the thiol compound may be greater than or equal to about 0.1 wt %, for example, greater than or equal to about 0.5 wt %, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, or greater than or equal to about 10 wt %, based on a total weight of the composition.

The composition may further include an organic solvent and/or a liquid vehicle (hereinafter, simply referred to as "organic solvent"). Types of the usable organic solvent are not particularly limited. Types and amounts of the organic solvent may be appropriately determined by considering the above main components (i.e., the quantum dot, the COOH group-containing binder, the photopolymerizable monomer, the photoinitiator, and if used, the thiol compound), and a type and an amount of an additive which is described below. The composition may include a solvent in a residual amount except for a desired amount of the solid content (non-volatile components). The solvent may be appropriately selected by considering the other components (e.g., a binder, a photopolymerizable monomer, a photoinitiator, and other additives) in the composition, affinity for an alkali-developing solution, a boiling point, and the like. Examples of the solvent may include ethylene glycols such as ethylene glycol, diethylene glycol, or polyethylene glycol; ethylene glycol ethers such as ethylene glycolmonomethylether, ethylene glycolmonoethylether, diethylene glycolmonomethylether, ethylene glycoldiethylether, or diethylene glycoldimethylether; ethylene glycol ether acetates such as ethylene glycolacetate, ethylene glycolmonoethyletheracetate, diethylene glycolmonoethyletheracetate, or diethylene glycolmonobutyletheracetate; propylene glycol such as propylene glycol; propylene glycolethers such as propylene glycolmonomethylether, propylene glycolmonoethylether, propylene glycol monopropylether, propyleneglycol monobutylether, propylene glycoldimethylether, dipropylene glycoldimethylether, propylene glycoldiethylether, or dipropylene glycoldiethylether; propylene glycoletheracetates such as propylene glycolmonomethyl ether acetate, or dipropylene glycolmonoethyletheracetate; amides such as N-methylpyrrolidone, dimethyl formamide, or dimethyl acetamide; ketones such as methylethylketone (MEK), methylisobutylketone (MIBK), or cyclohexanone; petroleums such as toluene, xylene, or solvent naphtha; esters such as ethyl acetate, butyl acetate, ethyl lactate, or ethyl 3-ethoxy propionate; ethers such as diethyl ether, dipropyl ether, or dibutyl ether, chloroform, a C1 to C40 aliphatic hydrocarbon (e.g., alkane, alkene, or alkyne), a halogen (e.g., chloro) substituted C1 to C40 aliphatic hydrocarbon (e.g., dichloroethane, trichloromethane, and the like), a C6 to C40 aromatic hydrocarbon (e.g., toluene, xylene, and the like), a halogen (e.g., chloro) substituted C6 to C40 aromatic hydrocarbon, or a combination thereof.

If desired, the composition may further include various additives such as a light diffusing agent, a leveling agent, or a coupling agent in addition to the aforementioned components. The amount of the additive is not particularly limited, and may be controlled within an appropriate range wherein the additive does not cause an adverse effect on preparation of the composition and production of the quantum dot-polymer composite and optionally a patterning of the composite. The additives may be a compound or material having a desired function without a particular limit.

If used, the additives may be used in an amount of greater than or equal to about 0.1 wt %, for example, greater than or equal to about 0.5 wt %, greater than or equal to about 1 wt %, greater than or equal to about 2 wt %, or greater than or equal to about 5 wt % based on a total weight of the composition, but is not limited thereto. If used, the amount of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt % based on a total weight of the composition, but is not limited thereto.

The composition may be prepared by appropriately mixing the above components.

In an embodiment, a quantum dot-polymer composite includes a polymer matrix; and the above cadmium free quantum dot dispersed in the polymer matrix. The polymer matrix may be a cross-linked polymer, a binder polymer having a carboxylic acid group, or a combination thereof. The cross-linked polymer may include a thiolene resin, cross-linked poly(meth)acrylate, cross-linked polyurethane, a cross-linked epoxy resin, a cross-linked vinyl polymer, a cross-linked silicone resin, or a combination thereof. In an embodiment, the polymer matrix may include a binder polymer, a polymerization product of a photopolymerizable monomer including a carbon-carbon double bond, a polymerization product of the photopolymerizable monomer and a multiple thiol compound having at least two thiol groups (e.g., at a terminal end thereof), or a combination thereof. The non-cadmium quantum dot, the binder polymer, the photopolymerizable monomer, and the multiple thiol compound are the same as described above.

The quantum dot polymer composite may have a form of a film. The film may have, for example, a thickness of less than or equal to about 30 µm, for example, less than or equal to about 10 µm, less than or equal to about 8 µm, or less than or equal to about 7 µm and greater than about 2 µm, for example, greater than or equal to about 3 µm, greater than or equal to about 3.5 µm, or greater than or equal to about 4 µm. The quantum dot polymer composite may exhibit improved thermal stability. Accordingly, the quantum dot polymer composite may exhibit photo-conversion efficiency (PCE) of greater than or equal to about 20% when heat-treated at about 180° C. for about 30 minutes under a nitrogen atmosphere.

In an embodiment, a display device includes a light source and a light emitting element (e.g., a photoluminescent element), and the light emitting element includes the above quantum dot-polymer composite, and the light source is configured to provide the light emitting element with incident light. The incident light may have a photoluminescence peak wavelength of greater than or equal to about 440 nm, for example, greater than or equal to about 450 nm and less than or equal to about 460 nm.

Figure 3:
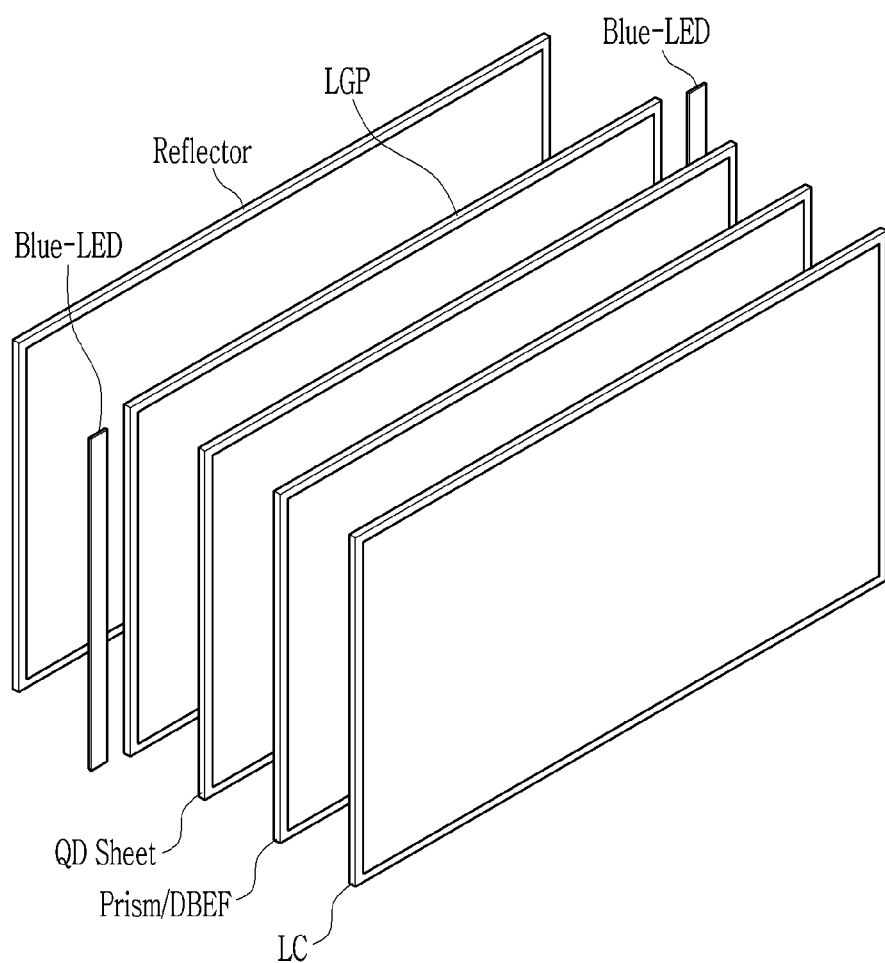
FIG. 3 is an exploded view of a display device according to an embodiment.

In an embodiment, the light emitting element may include a sheet of the quantum dot polymer composite. The display device may further include a liquid crystal panel and the sheet of the quantum dot polymer composite may be disposed between the light source and the liquid crystal panel. FIG. 3 shows an exploded view of a display device. Referring to FIG. 3, the display device may have a structure wherein a reflector, a light guide panel (LGP) and a blue LED light source (Blue-LED), the quantum dot-polymer composite sheet (QD sheet), and various optical films such as a prism, double brightness enhance film (DBEF), and the like are stacked, and a liquid crystal panel is disposed thereon.

In an embodiment, the display device may include a stacked structure including a (e.g., transparent) substrate and a light emitting layer (e.g., a photoluminescent layer) disposed on the substrate as a light emitting element. In the stacked structure, the light emitting layer includes a pattern of the quantum dot polymer composite, and the pattern may include at least one repeating section configured to emit light of a predetermined wavelength. The pattern of the quantum dot polymer composite may include a first repeating section that may emit a first light, a second repeating section that may emit a second light, or a combination thereof.

The first light and the second light have a different maximum photoluminescence peak wavelength in a photoluminescence spectrum. In an embodiment, the first light may be red light (R) having a maximum photoluminescence peak wavelength of about 600 nm to about 650 nm (e.g., about 620 nm to about 650 nm), the second light may be green light (G) having a maximum photoluminescence peak wavelength of about 500 nm to about 550 nm (e.g., about 510 nm to about 550 nm), or vice versa (i.e., the first light may be a green light and the second light may be a red light).

The substrate may be a substrate including an insulation material. The substrate may include a material of glass; various polymers such as a polyester (e.g., poly(ethylene terephthalate) (PET), poly(ethylene naphthalate) (PEN), or the like), polycarbonate, a poly(C1 to C10(meth)acrylate), polyimide, polyamide, or a combination thereof (a copolymer or a mixture thereof); polysiloxane (e.g., PDMS); an inorganic material such as $Al_2O_3$ or $ZnO$; or a combination thereof, but is not limited thereto. A thickness of the substrate may be desirably selected considering a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dot.

At least a portion of the substrate may be configured to cut (absorb or reflect) blue light. A layer capable of blocking (e.g., absorbing or reflecting) blue light, also referred to herein as a "blue cut layer" or "blue light absorption layer", may be disposed on at least one surface of the substrate. For example, the blue cut layer (blue light absorption layer) may include an organic material and a predetermined dye, such as, for example, a yellow dye or a dye capable of absorbing blue light and transmitting green and/or red light.

In an embodiment, a method of producing the stacked structure includes forming a film of the above composition on a substrate;

exposing a selected region of the film to light (e.g., having a wavelength of less than or equal to about 400 nm); and developing the exposed film with an alkali developing solution to obtain a pattern of the quantum dot polymer composite.

The details of the substrate and the composition are the same as described above.

Figure 4:
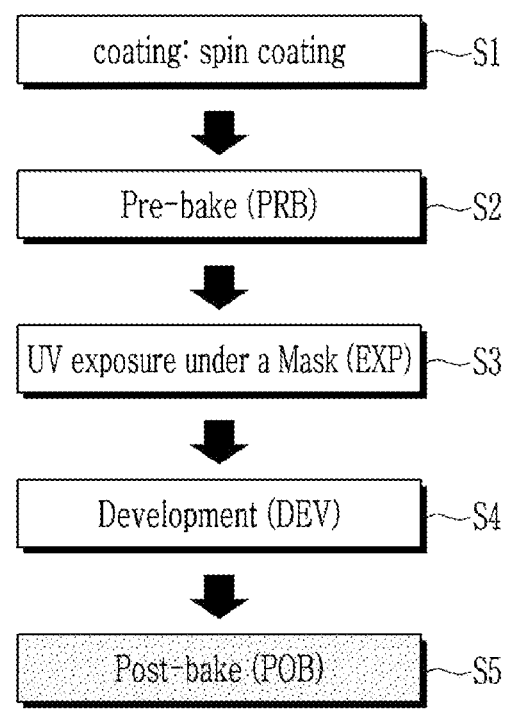
FIG. 4 shows a process of producing a quantum dot polymer composite pattern using a composition according to an embodiment.
Figure 4:
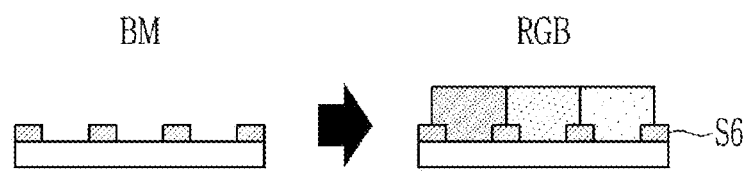

A method of forming a pattern of the quantum dot polymer composite is explained with reference to FIG. 4.

The composition is coated to have a predetermined thickness on a substrate in an appropriate method of spin coating, slit coating, and the like (S1). If desired, the formed film may be pre-baked (PRB, S2). Conditions (such as a temperature, a duration, and an atmosphere) for the pre-baking may be selected appropriately.

The formed (and optionally, pre-baked) film is exposed to light of a predetermined wavelength (UV light) under a mask having a predetermined pattern (EXP, S3). The wavelength and the intensity of light may be selected depending on the types and the amounts of the photoinitiator, the types and the amounts of quantum dots, or the like.

The film having the exposed selected area is treated (e.g., sprayed or immersed) with an alkali developing solution, and thereby the unexposed region in the film is dissolved to provide a desired pattern, this process being referred to as development (DEV) (S4). The obtained pattern may be post-baked (S5, FOB), if desired, for example, at a temperature of about 150° C. to about 230° C. for a predetermined time, for example, greater than or equal to about 10 min or greater than or equal to about 20 min, in order to improve crack resistance and solvent resistance of the pattern, When the quantum dot-polymer composite pattern has a plurality of repeating sections, a quantum dot-polymer composite having a desired pattern may be obtained by preparing a plurality of compositions including a quantum dot (e.g., a red light emitting quantum dot, a green light emitting quantum dot, or optionally, a blue light emitting quantum dot) having desired photoluminescence properties (a photoluminescence peak wavelength and the like) to form each repeating section and repeating the pattern formation process for each of the composition as many times (e.g., twice or more or three times or more) as required to form a desired pattern of the quantum dot polymer composite (S6).

In an embodiment, an ink composition of an embodiment including the population of the cadmium free quantum dots and the liquid vehicle may be used to form a pattern. For example, a pattern may be formed by depositing the ink composition including a plurality of cadmium free quantum dots, a liquid vehicle, and a monomer on a desired region of a substrate, optionally removing the liquid vehicle and conducting a polymerization.

For example, the quantum dot-polymer composite may be in the form of a pattern of at least two different repeating color sections (e.g., RGB sections). Such a quantum dot-polymer composite pattern may be used as a photoluminescence-type color filter in a display device.

In other embodiments, a display device includes a light source and a light emitting element including a stacked structure (hereinafter, also referred to as a layered structure).

The light source may be configured to provide incident light to the light emitting element including the layered structure. The incident light may have a wavelength of about 440 nm to about 480 nm such as about 440 nm to about 470 nm. The incident light may be a third light.

In a display device including the stacked structure, the light source may include a plurality of light emitting units respectively corresponding to the first section and the second section, and the light emitting units may include a first electrode and a second electrode facing each other and an electroluminescent layer disposed between the first electrode and the second electrode. The electroluminescent layer may include an organic light emitting material.

For example, each light emitting unit of the light source may include an electroluminescent device (e.g., an organic light emitting diode (OLED)) structured to emit light of a predetermined wavelength (e.g., blue light, green light, or a combination thereof). Structures and materials of the electroluminescent device such as the organic light emitting diode (OLED) are not particularly limited.

Figure 5A:
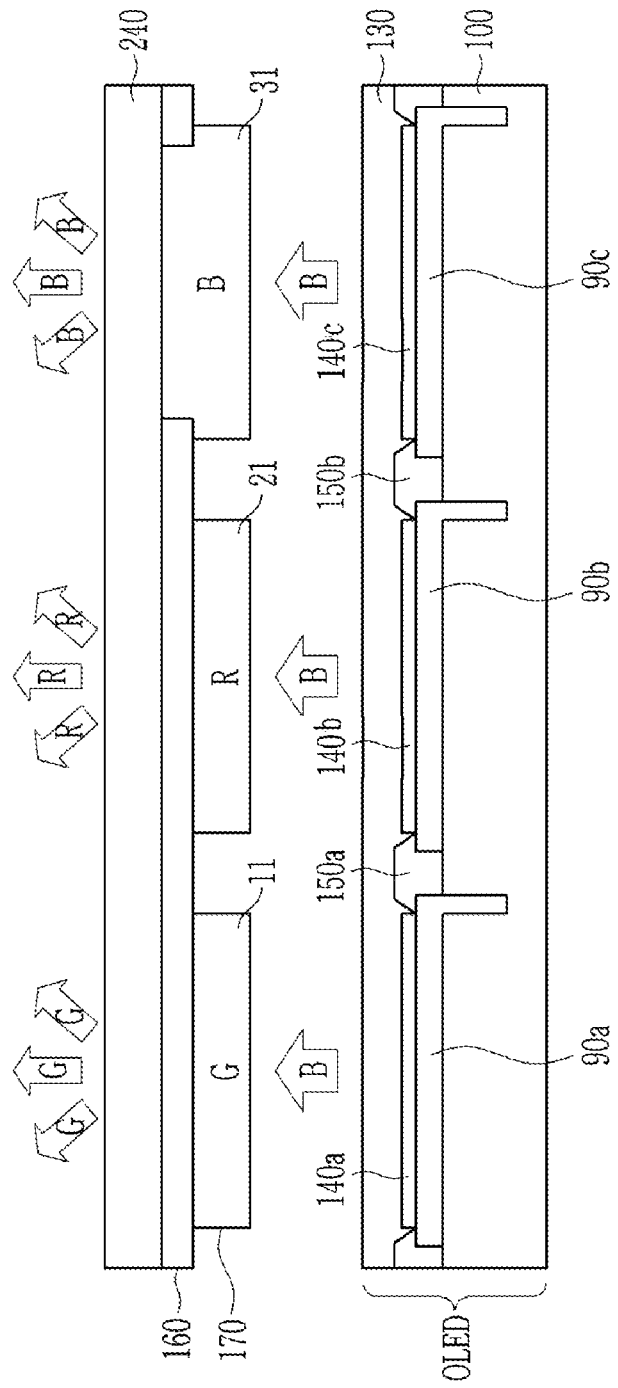
FIG. 5A is a schematic cross-sectional view of a display device according to an embodiment.
Figure 5B:
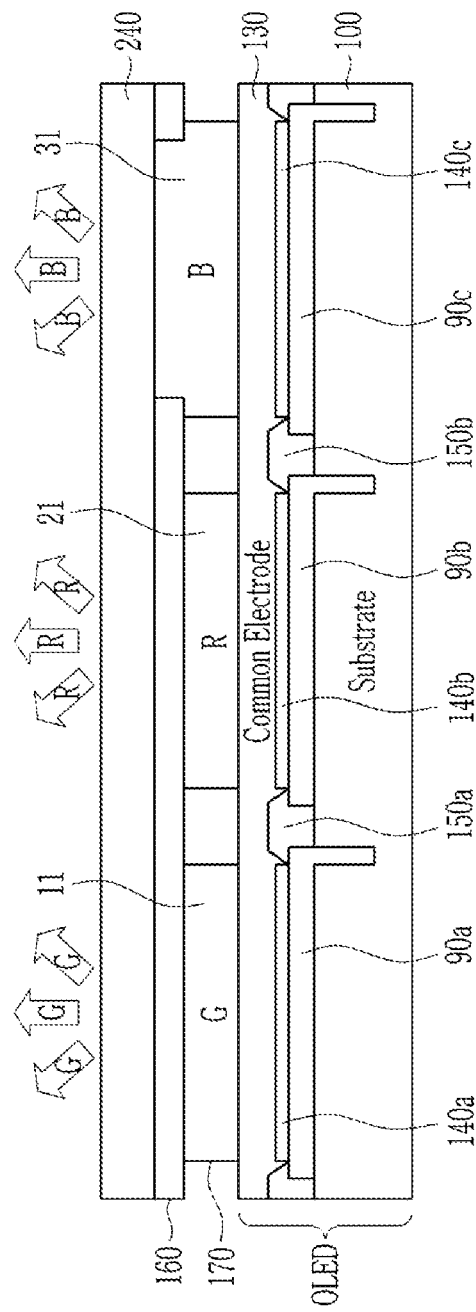
FIG. 5B is a schematic cross-sectional view of a display device according to an embodiment.

FIG. 5A and FIG. 5B show a schematic cross-sectional view of a display including a layered structure of an embodiment. Referring to FIG. 5A and FIG. 5B, the light source may include an organic light emitting diode OLED. For example, the OLED may emit blue light or a light having a wavelength in a region of about 500 nm or less. The organic light emitting diode OLED may include (at least two, for example, three) pixel electrodes 90*a*, 90*b*, 90*c* formed on a substrate 100, a pixel defining layer 150*a*, 150*b* formed between the adjacent pixel electrodes 90*a*, 90*b*, 90*c*, an organic light emitting layer 140*a*, 140*b*, 140*c* formed on the pixel electrodes 90*a*, 90*b*, 90*c*, and a common electrode layer 130 formed on the organic light emitting layer 140*a*, 140*b*, 140*c*.

A thin film transistor and a substrate may be disposed under the organic light emitting diode. The pixel areas of the OLED may be disposed corresponding to the first, second, and third sections that will be described in detail below, respectively.

The stacked structure that includes a quantum dot-polymer composite pattern (e.g., including a first repeating section including green light emitting quantum dots and/or a second repeating section including red light emitting quantum dots) and a substrate, or the quantum dot-polymer composite pattern, may be disposed on or over a light source, for example, directly on the light source.

The light (e.g., blue light) emitted from the light source may enter the second section 21 and the first section 11 of the pattern 170 to emit (e.g., converted) red light R and green light G, respectively. The blue light B emitted from the light source passes through or transmits from the third section 31. Over the second section 21 emitting red light and/or the first section 11 emitting green light, an optical element 160 may be disposed. The optical element may be a blue cut layer which cuts (e.g., reflects or absorbs) blue light and optionally green light, or a first optical filter. The blue cut layer 160 may be disposed on the upper substrate 240. The blue cut layer 160 may be disposed between the upper substrate 240 and the quantum dot-polymer composite pattern and over the first section 11 and the second section 21. Details of the blue cut layer are the same as set forth for the first optical filter 310 below.

The aforementioned device of an embodiment may be fabricated by separately preparing the layered structure and the OLED (for example, the blue OLED), respectively, and combining them. Alternatively, the device may be fabricated by directly forming the pattern of the quantum dot-polymer composite over the OLED.

In an embodiment, the display device may further include a lower substrate 210, an optical element (e.g., polarizer) 300 disposed below the lower substrate 210, and a liquid crystal layer 220 interposed between the layered structure and the lower substrate 210. The layered structure may be disposed in such a manner that a light emitting layer (i.e., the quantum dot-polymer composite pattern) faces the liquid crystal layer. The display device may further include an optical element (e.g., polarizer) 300 between the liquid crystal layer 220 and the light emitting layer. The light source may further include an LED and optionally a light guide panel.

Figure 6:
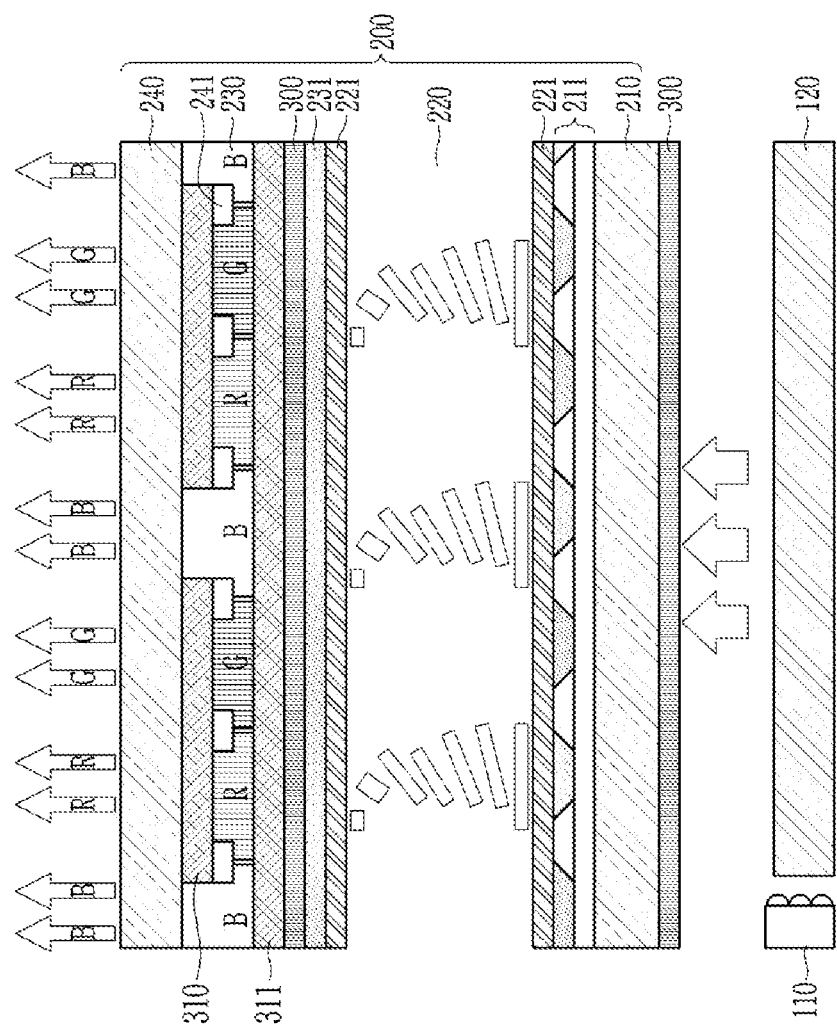
FIG. 6 is a schematic cross-sectional view of a display device according to an embodiment.

Referring to FIG. 6, in an embodiment, the display device includes a liquid crystal panel 200, a lower optical element 300 (e.g., polarizer) disposed on and/or under the liquid crystal panel 200, and a backlight unit including a blue light emitting light source 110 under a lower optical element 300. The backlight unit may include a light source 110 and a light guide panel 120 (edge type). Alternatively, the backlight unit may be a direct light source without a light guide panel. The liquid crystal panel 200 may include a lower substrate 210, an upper substrate 240, and a liquid crystal layer 220 between the upper and lower substrates, and a light emitting layer (color filter layer) 230 disposed on or under the upper substrate 240. The light emitting layer 230 may include the quantum dot-polymer composite (or a pattern thereof).

A wire plate 211 is provided on an internal surface, for example, on the upper surface of the lower substrate 210. The wire plate 211 may include a plurality of gate wires and data wires that define a pixel area, a thin film transistor disposed adjacent to a crossing region of gate wires and data wires, and a pixel electrode for each pixel area, but is not limited thereto. Details of such a wire plate are not particularly limited.

The liquid crystal layer 220 may be disposed on the wire plate 211. The liquid crystal layer 220 may include an alignment layer 221 on an upper surface of the liquid crystal layer 220 and on a lower surface of the liquid crystal layer 220, to initially align the liquid crystal material included therein. Details regarding a liquid crystal material, an alignment layer material, a method of forming an alignment layer, a method of forming a liquid crystal layer, a thickness of liquid crystal layer, or the like are not particularly limited.

In an embodiment, an upper optical element or an upper polarizer 300 may be provided between the liquid crystal layer 220 and the upper substrate 240, but it is not limited thereto. For example, the upper optical element or upper polarizer 300 may be disposed between the liquid crystal layer 220 (or a common electrode 231) and the light emitting layer (or the quantum dot-polymer composite pattern). A black matrix 241 may be provided under the upper substrate 240 (e.g., on a lower surface thereof). Openings within the black matrix 241 are aligned with (or provided to hide) a gate line, a data line, and a thin film transistor of a wire plate 211 on the lower substrate 210. A second section (R) including a color filter emitting red light, a first section (G) including a color filter emitting green light and/or a third section (B) including a color filter for emitting or transmitting blue light may be disposed in the openings within the black matrix 241 (BM). For example, the black matrix 241 may have a lattice shape. If desired, the light emitting layer may further include at least one of a fourth repeating section. The fourth repeating section may be configured to emit light having a color (e.g., cyan, magenta, yellow, or the like) different from the colors of the light emitted from the first to third sections.

The light emitting layer (color filter layer) 230 may be on a transparent common electrode 231.

If desired, the display device may further include a blue cut filter 310, hereinafter, also referred to as a first optical filter layer 310. The first optical filter layer 310 may be disposed between upper surfaces of the second section (R) and the first section (G) and the lower surface of the upper substrate 240, or on an upper surface of the upper substrate (240). The first optical filter layer 310 may include a sheet having openings that correspond to the third section (B) (e.g., a pixel area showing, e.g., emitting, a blue color) and may be formed on portions corresponding to the first and second sections (G, R). The first optical filter layer 310 may be formed as a single body structure over the portions of the light emitting layer 230 corresponding to the first and second sections (G, R), and which are other than the portions overlapping the third section, but is not limited thereto. Alternatively, at least two first optical filter layers may be spaced apart from each other and may be disposed over each of the portions overlapping the first and the second sections, respectively.

For example, the first optical filter layer may block light having a predetermined wavelength range in the visible light range and may transmit light having another wavelength range. For example, the first optical filter layer may block blue light and transmit light other than blue light. For example, the first optical filter layer may transmit green light, red light, or yellow light (e.g., the mixed light of the green light and the red light).

The first optical filter layer may include a polymer thin film including a dye and/or a pigment that absorbs light having a specific wavelength, i.e., the wavelength to be blocked. The first optical filter layer may block at least 80%, or at least 90%, even at least 95% of blue light having a wavelength of less than or equal to about 480 nm. With respect to the visible light having other wavelengths, the first optical filter layer may have a light transmittance of greater than or equal to about 70%, for example, greater than or equal to about 80%, greater than or equal to about 90%, or even up to 100%.

The first optical filter layer may absorb and substantially block blue light having a wavelength of less than or equal to about 500 nm, and for example, may selectively transmit green light or red light. In this case, at least two first optical filter layers may be spaced apart and disposed on each of the portions overlapping the first and second sections, respectively. For example, the first optical filter layer selectively transmitting red light may be disposed on the portion overlapping the section emitting red light and the first optical filter layer selectively transmitting green light may be disposed on the portion overlapping the section emitting green light.

In an embodiment, the first optical filter layer may include at least one of a first region and a second region. The first region of the first optical filter layer blocks (e.g., absorbs) blue light and red light and transmits light having a wavelength of a predetermined range, e.g., a wavelength greater than or equal to about 500 nm, greater than or equal to about 510 nm, or greater than or equal to about 515 nm, and less than or equal to about 550 nm, less than or equal to about 540 nm, less than or equal to about 535 nm, less than or equal to about 530 nm, less than or equal to about 525 nm, or less than or equal to about 520 nm. The second region of the first optical filter layer blocks (e.g., absorb) blue light and green light and transmits light having a wavelength of a predetermined range, e.g., a wavelength of greater than or equal to about 600 nm, greater than or equal to about 610 nm, or greater than or equal to about 615 nm and less than or equal to about 650 nm, less than or equal to about 640 nm, less than or equal to about 635 nm, less than or equal to about 630 nm, less than or equal to about 625 nm, or less than or equal to about 620 nm. The first region of the first optical filter layer may be disposed (directly) on or over a location overlapping a green light emitting section and the second region of the first optical filter layer may be disposed (directly) on or over a location overlapping a red light emitting section. The first region and the second region may be optically isolated from one another, for example, by a black matrix. The first optical filter layer may contribute to improving the color purity of a display device.

The first optical filter layer may be a reflection type filter including a plurality of layers (e.g., inorganic material layers) each having a different refractive index. For example, in the first optical layer, two layers having different refractive indices may be alternately stacked on each other. For example, a layer having a high refractive index and a layer having a low refractive index may be alternately laminated with each other.

The display device may further include a second optical filter layer 311 (e.g., red/green light or yellow light recycling layer) that is disposed between the light emitting layer 230 and the liquid crystal layer 220, and between the light emitting layer 230—(e.g., the quantum dot polymer composite layer) and the upper polarizer 300. The second optical filter layer 311 may transmit at least a portion of a third light, and reflect at least a portion of a first light and/or a second light. The second optical filter layer may reflect light having a wavelength of greater than 500 nm. The first light may be green (or red) light, the second light may be red (or green) light, and the third light may be blue light.

The display device may exhibit improved luminance (e.g., greater than or equal to about 100 nits (candelas per square meter)) and a wide viewing angle (e.g., greater than or equal to about 160°).

An embodiment provides an electronic device including the quantum dot. The electronic device may include a light emitting diode (LED), an organic light emitting diode (OLED), a sensor, a solar cell, an imaging sensor, or a liquid crystal display (LCD), but is not limited thereto.

Hereinafter, the embodiments are illustrated in more detail with reference to examples. However, they are exemplary examples of the present disclosure, and the present disclosure is not limited thereto.

EXAMPLES

Analysis Method

1. Ultraviolet-Visible (UV-Vis) Spectroscopy Analysis

An Agilent Cary 5000 spectrometer is used to perform an ultraviolet (UV) spectroscopy analysis and obtain an UV-Visible absorption spectrum.

2. Photoluminescence Analysis

A Hitachi F-7000 spectrometer is used to obtain a photoluminescence (PL) spectrum of the produced quantum dots with an excitation light having a wavelength of 450 nanometers (nm).

3. Absolute Quantum Efficiency (Quantum Yield) of Quantum Dot

Quantum efficiency is obtained by dividing the number of photons emitted along with photoluminescence from a sample by the number of photons absorbed by the sample. The quantum efficiency is measured with respect to the quantum dot dispersion or a quantum dot-polymer composite by using HAMAMATSU-Quantaurus-QY, C11347 (Hamamatsu Corp.).

4. ICP-AES Analysis

Inductively coupled plasma atomic emission spectroscopy (ICP-AES) analysis is performed by using Shimadzu ICPS-8100.

5. Quantum Efficiency of Composite Film

Quantum efficiency of a composite film is measured by putting the composite film in an integrating sphere and irradiating the same with excitation light of a wavelength of 450 nm.

6. TEM Analysis

A Titan ChemiSTEM electron microscope is used to perform a transmission electron microscope analysis to measure the particle size of the quantum dot.

Reference Example 1

Indium acetate and palmitic acid are dissolved in 1-octadecene in a 200 millimeter (mL) reaction flask, and the solution is heated at 120° C. under vacuum. Indium and palmitic acid are used in a mole ratio of 1:3. After one hour, an atmosphere in the reactor is converted into nitrogen. After heating the reactor at 280° C., a mixed solution of tris (trimethylsilyl)phosphine (TMS3P) and trioctylphosphine is rapidly injected thereinto, and the mixture is reacted for 20 minutes. The reaction solution is rapidly cooled down to room temperature, acetone is added thereto, the mixture is centrifuged to obtain a precipitate, and the precipitate is dispersed in toluene again. An amount of TMS3P is 0.5 moles (mol) per 1 mol of indium. An amount of TOP is 0.1 moles to 10 moles (e.g. 0.5 mole) per 1 mole of indium. An InP core obtained therefrom has a size of about 3 nm.

Example 1

(1) Selenium is dispersed in trioctylphosphine to prepare a Se/TOP stock solution, and sulfur is dispersed in trioctylphosphine to prepare a S/TOP stock solution.

Zinc acetate and oleic acid are dissolved in trioctylamine in a 200 mL reaction flask, and the solution is vacuum-treated at 120° C. for 10 minutes. After substituting the atmosphere inside the reaction flask with $N_2$, a dispersion of InP semiconductor nanocrystals in toluene is added to the solution, while the solution is heated up to 320° C., the Se/TOP and optionally, the zinc acetate are three times injected into the reaction flask. The reaction proceeds to obtain a reaction solution including a particle having a ZnSe shell disposed on the core. A total reaction time is 80 minutes.

Subsequently, an S/TOP stock solution and the zinc acetate are injected into the reaction solution at the reaction temperature of 320° C. A reaction is performed to obtain a reaction solution including a particle having a ZnS shell disposed on the ZnSe shell. A total reaction time is 80 minutes.

In the reaction, a total amount of Se is 7.5 moles, a total amount of S is 13.9 moles, and a total amount of zinc is 16 mol based on 1 mol of indium. An excess amount of ethanol is added to a reactant including the obtained core/multi-layered shell quantum dot, and the mixture is centrifuged. After the centrifugation, a supernatant is discarded therefrom, a precipitate therein is dried and then dispersed in chloroform or toluene to obtain a quantum dot solution (hereinafter, a QD solution).

(2) An ICP-AES analysis of the obtained QD is performed, and the result is shown in Table 1. A TEM analysis, a UV-vis spectroscopy analysis, and a photoluminescence analysis of the QD are performed. The results are shown in Table 2.

Example 2

A core/multi-layered shell quantum dot is obtained according to the same method as Example 1 except for using 9.7 mol of Se, 20.7 mol of S, and 21 mol of zinc based on 1 mol of indium.

An ICP-AES analysis of the QD performed, and the result is shown in Table 1. A TEM analysis, a UV-vis spectroscopy analysis, and a photoluminescence analysis of the QD are performed. The results are shown in Table 2.

Example 3

A core/multi-layered shell quantum dot is obtained according to the same method as Example 1 except for using 8.2 mol of Se, 11.5 mol of S, and 17 mol of zinc based on 1 mol of indium.

An ICP-AES analysis of the obtained QD is performed, and the result is shown in Table 1. A TEM analysis, a UV-vis spectroscopy analysis, and a photoluminescence analysis of the QD are performed. The results are shown in Table 2.

Example 4

A core/multi-layered shell quantum dot is obtained according to the same method as Example 1 except for using 10 mol of Se, 17.6 mol of S, and 21 mol of zinc based on 1 mol of indium.

An ICP-AES analysis of the obtained QD is performed, and the result is shown in Table 1. A TEM analysis, a UV-vis spectroscopy analysis, and a photoluminescence analysis of the QD are performed. The results are shown in Table 2.

Comparative Example 1

A core/multi-layered shell quantum dot is obtained according to the same method as Example 1 except for using 5.6 mol of Se, 15 mol of S, and 14.5 mol of zinc based on 1 mol of indium.

An ICP-AES analysis of the obtained QD is performed, and the result is shown in Table 1. A TEM analysis, a UV-vis spectroscopy analysis, and a photoluminescence analysis of the QD are performed. The results are shown in Table 2.

Comparative Example 2

A core/multi-layered shell quantum dot is obtained according to the same method as Example 1 except for using 6.2 mol of Se, 15.4 mol of S, and 16.7 mol of zinc based on 1 mol of indium.

An ICP-AES analysis of the obtained QD is performed, and the result is shown in Table 1. A TEM analysis, a UV-vis spectroscopy analysis, and a photoluminescence analysis of the QD are performed. The results are shown in Table 2.

Comparative Example 3

A core/multi-layered shell quantum dot is obtained according to the same method as Example 1 except for using 1.7 mol of Se, 6.2 mol of S, and 9 mol of zinc based on 1 mol of indium.

ICP-AES analyses of the obtained QDs are performed, and the results are shown in Table 1. A TEM analysis, a UV-vis spectroscopy analysis, and a photoluminescence analysis of the QD are performed. The results are shown in Table 2.

TABLE 1

| | Relative Mole Amount | | | | |
|---|---|---|---|---|---|
| | P/In | (S + Se)/In | Zn/In | Se/In | In |
| Comparative Example 1 | 0.82 | 9.66 | 11.23 | 5.09 | 1.00 |
| Comparative Example 2 | 0.76 | 10.3 | 12.45 | 5.64 | 1.00 |
| Comparative Example 3 | — | 3.5 | 5.3 | 1.6 | 1.00 |
| Example 1 | 0.76 | 11 | 12.56 | 6.79 | 1.00 |
| Example 2 | 0.63 | 15.15 | 16.63 | 8.80 | 1.00 |
| Example 3 | 0.76 | 10.96 | 12.58 | 7.47 | 1.00 |
| Example 4 | 0.81 | 14.36 | 16.42 | 9.02 | 1.00 |

TABLE 2

| | VD | HWHM (nm) | FWHM (nm) | QY (%) | Size (nm) | PL Wavelength (nm) |
|---|---|---|---|---|---|---|
| Comparative Example 1 | 0.04 | 27 | 41 | 87 | 7.2 | 629 |
| Comparative Example 2 | 0.182 | 25 | 41 | 82 | 7.6 | 628 |
| Comparative Example 3 | 0.33 | 28 | 44 | 56 | 5.6 | 621 |
| Example 1 | 0.261 | 24 | 39 | 89 | 7.7 | 630 |
| Example 2 | 0.33 | 24 | 38 | 90 | 8.5 | 631 |
| Example 3 | 0.355 | 22 | 38 | 90 | 8.1 | 631 |
| Example 4 | 0.449 | 21 | 36 | 90 | 8.7 | 628 |

Referring to the results of the tables, the quantum dots according to example embodiments have a relatively large VD and exhibit improved luminous efficiency and a low full width at half maximum (FWHM) compared with the quantum dots according to Comparative Examples.

Experimental Example: Quantum Dot Polymer Composite and Its Pattern

Each quantum dot chloroform dispersion according to Example 4 and Comparative Example 3 is mixed with a binder (a quaternary copolymer of methacrylic acid, benzyl methacrylate, 2-hydroxyethylmethacrylate, and styrene, an acid value: 130 mg KOH/g, a molecular weight: 8000 g/mol, a methacrylic acid:benzylmethacrylate:2-hydroxyethyl-methacrylate:styrene (a mole ratio)=61.5:12:16.3:10.2) solution (solvent:propylene glycol monomethyl ether acetate (PGMEA) having a concentration of 30 weight percent (wt %)) to prepare quantum dot-binder dispersion.

The quantum dot binder dispersion is mixed with hexaacrylate having the following structure as a photopolymerizable monomer, ethylene glycol di-3-mercaptopropionate (hereinafter, 2T), an oximeester compound as an initiator, $TiO_2$ as a light diffusing agent and PGMEA to prepare a composition.

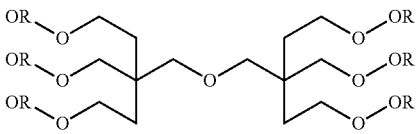

wherein

-continued

OR = 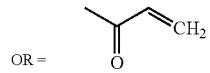

The composition includes 40 wt % of the quantum dot, 12.5 wt % of the binder polymer, 25 wt % of 2T, 12 wt % of the photopolymerizable monomer, 0.5 wt % of the initiator, and 10 wt % of the light diffusing agent based on a solid content of the composition, and a total solid content is 25%.

Each photosensitive composition is spin-coated on a glass substrate at 150 revolutions per minute (rpm) for 5 seconds to obtain films. The films are pre-baked (PRB) at 100° C. These pre-baked films are exposed to irradiation of light (a wavelength: 365 nm, intensity: 100 millijoules (mJ)) for 1 second under a mask having a predetermined pattern (e.g., a square dot or a stripe pattern), developed in a potassium hydroxide aqueous solution (a concentration: 0.043%) for 50 seconds to obtain quantum dot-polymer composite patterns (a thickness: 6 micrometers (μm)).

The obtained pattern is heat-treated (i.e., post-baked, FOB) at 180° C. for 30 minutes under a nitrogen atmosphere.

Quantum efficiency after PRB and FOB and a process maintenance of the obtained film (composite) are measured and calculated, and the results are shown in Table 3.

TABLE 3

|  | Quantum efficiency after PRB (%) | Quantum efficiency after POB (%) | Process maintenance (%) |
| --- | --- | --- | --- |
| Example 4 | 30 | 23.8 | 79 |
| Comparative Example 3 | 29.1 | 19.1 | 66 |

The process maintenance is a percentage of the quantum efficiency after FOB relative to the quantum efficiency after PRB.

Referring to the results of Table 3, the quantum dot-polymer composite pattern including the quantum dot according to Example 4 exhibits improved photo-conversion efficiency and stability (i.e., a process maintenance rate) compared with the quantum dot-polymer composite pattern including the quantum dot according to Comparative Example 3.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot composite pattern comprising a first color section,
wherein the first color section comprises a first quantum dot composite comprising a matrix and cadmium free quantum dots dispersed in the matrix,
wherein the cadmium free quantum dots comprise indium and phosphorus,
wherein the cadmium free quantum dots do not comprise cadmium,
wherein the cadmium free quantum dots are configured to emit a first light having a maximum photoluminescence peak in a red light wavelength region of greater than or equal to about 600 nanometers and less than or equal to about 650 nanometers,
wherein in an ultraviolet-visible absorption spectrum, the cadmium free quantum dots are configured to exhibit a first absorption peak having a half width at half maximum of less than or equal to about 25 nanometers.

2. The quantum dot composite pattern of claim 1, wherein the half width at half maximum of the first absorption peak is less than or equal to about 24 nanometers.

3. The quantum dot composite pattern of claim 1, wherein the half width at half maximum of the first absorption peak is less than or equal to about 23 nanometers.

4. The quantum dot composite pattern of claim 1, wherein in the ultraviolet-visible absorption spectrum of the cadmium free quantum dot, a valley depth defined by the following equation is greater than or equal to about 0.2:

$(Abs_{first} - Abs_{valley})/Abs_{first} =$ valley depth wherein, $Abs_{first}$ is an absorption intensity at the first absorption peak wavelength and $Abs_{valley}$ is an absorption intensity at a lowest point of the valley.

5. The quantum dot composite pattern of claim 4, wherein the valley depth is from about 0.35 to 0.449.

6. The quantum dot composite pattern of claim 4, wherein the valley depth is from about 0.2 to 0.449.

7. The quantum dot composite pattern of claim 1, wherein the cadmium free quantum dots further comprise zinc, selenium, sulfur, or a combination thereof.

8. The quantum dot composite pattern of claim 1, wherein the cadmium free quantum dots further comprise zinc, selenium, and sulfur.

9. The quantum dot composite pattern of claim 1, wherein the first absorption peak is present in a range of greater than or equal to about 580 nanometers and less than or equal to about 650 nanometers.

10. The quantum dot composite pattern of claim 1, wherein the first absorption peak is present in a range of greater than or equal to about 600 nanometers and less than or equal to about 630 nanometers and the red light wavelength region is greater than or equal to about 610 nanometers and less than or equal to about 640 nanometers.

11. The quantum dot composite pattern of claim 1, wherein the first quantum dot composite further comprises a metal oxide particulate.

12. The quantum dot composite pattern of claim 1, further comprising a second color section that is configured to emit a second light different from the first light and optionally wherein a black matrix is disposed between the second color section and the first color section.

13. The quantum dot composite pattern of claim 12, wherein the second color section comprises a second quantum dot composite comprising a matrix and quantum dots configured to emit the second light.

14. The quantum dot composite pattern of claim 1, wherein a thickness of the first quantum dot composite is greater than or equal to about 2 micrometers and less than or equal to about 30 micrometers.

15. The quantum dot composite pattern of claim 1, wherein the first quantum dot composite is configured to show a photoconversion efficiency of from about 20% to 30%.

16. A stacked structure comprising a substrate, the quantum dot composite pattern of claim 1, and optionally an optical element disposed between the substrate and the first color section of the quantum dot composite pattern, wherein if present, the optical element is configured to reflect or absorb blue light and optionally green light.

17. A display device comprising the stacked structure of claim 16 and a light source, wherein the light source is configured to provide the quantum dot composite pattern with incident light.

18. A display device comprising the quantum dot composite pattern of claim 1 and a light source, and
   wherein the light source is configured to provide the quantum dot composite pattern with incident light.

19. The display device of claim 18, wherein the quantum dot composite pattern further comprises a second color section that is configured to emit a second light different from the first light, and wherein the light source comprises a plurality of light emitting units each corresponding to the first color section and the second color section, respectively.

20. The display device of claim 18, wherein the light source comprises a first electrode, a second electrode, and a luminescent layer disposed between the first electrode and the second electrode.

* * * * *